United States Patent
Fuseya

(10) Patent No.: US 7,596,706 B2
(45) Date of Patent: Sep. 29, 2009

(54) SEMICONDUCTOR INTEGRATED CIRCUIT WITH LOGIC TO MONITOR AND CONTROL ITS POWER SUPPLIES

(75) Inventor: Tomokatsu Fuseya, Odawara (JP)

(73) Assignee: Hitachi, Ltd, Tokyo (JP)

( * ) Notice: Subject to any disclaimer, the term of this patent is extended or adjusted under 35 U.S.C. 154(b) by 534 days.

(21) Appl. No.: 11/430,159

(22) Filed: May 9, 2006

(65) Prior Publication Data
US 2007/0226557 A1 Sep. 27, 2007

(30) Foreign Application Priority Data
Mar. 24, 2006 (JP) .............................. 2006-083837

(51) Int. Cl.
*G06F 1/28* (2006.01)
(52) U.S. Cl. ..................................... 713/300
(58) Field of Classification Search ................. 713/300
See application file for complete search history.

(56) References Cited

U.S. PATENT DOCUMENTS

| | | | | |
|---|---|---|---|---|
| 5,510,748 A | * | 4/1996 | Erhart et al. ................ 327/530 |
| 6,629,291 B1 | * | 9/2003 | Houghton et al. ............... 716/1 |
| 6,664,657 B2 | * | 12/2003 | Hailey .......................... 307/52 |
| 6,995,599 B2 | * | 2/2006 | Huang et al. ................. 327/408 |
| 2004/0085690 A1 | | 5/2004 | Ito et al. | |
| 2005/0188230 A1 | * | 8/2005 | Bilak .......................... 713/300 |

FOREIGN PATENT DOCUMENTS

JP   2002-083872   3/2002

* cited by examiner

*Primary Examiner*—Thomas Lee
*Assistant Examiner*—Eric Chang
(74) *Attorney, Agent, or Firm*—Stites & Harbison PLLC; Juan Carlos A. Marquez, Esq.

(57) ABSTRACT

An LSI chip has an internal logic, power supply control circuit and module control circuits, mounted thereon. External modules are provided outside the LSI chip. A power supply circuit for supplying power to the internal logic is composed of the module control circuits and external modules, that is, the power supply circuit is multiplexed, so that if a failure occurs in one of the power supplies, a different normally-operating power supply supplies power to the internal logic. Accordingly, the reliability of the LSI chip is improved.

8 Claims, 30 Drawing Sheets

SEMICONDUCTOR INTEGRATED CIRCUIT WITH LOGIC TO MONITOR AND CONTROL ITS POWER SUPPLIES

CROSS REFERENCES TO RELATED APPLICATIONS

This application relates to and claims priority from Japanese Patent Application No. 2006-083837, filed on Mar. 24, 2006 the entire disclosure of which is incorporated herein by reference.

BACKGROUND OF THIS INVENTION

The present invention relates to a semiconductor integrated circuit with a built-in power supply circuit for stepping down the voltage of an external power supply; and a semiconductor integrated circuit device. For example, this invention relates to a technique suitable for use in storage systems having disk array apparatuses that require low-voltage and low-power semiconductor chips.

In accordance with the trend toward low operating voltages in semiconductor chips with logic circuits (internal logic), e.g., large scale integrated circuit (LSI) chips, semiconductor chips (LSI chips) with built-in power supply circuits such as DC-DC converters have been known. With the power supply circuits included in the semiconductor chips, the lengths of lines connecting the power supply circuits and the logic circuits may be short, thereby decreasing noise in the power supplies. In this case, if the built-in power supply circuits generate the power supply voltage used in the logic circuits, only one kind of power is supplied to the logic circuits, which facilitates substrate mounting.

However, in accordance with the trend toward multi supply voltages in semiconductor chips, if the semiconductor chips include both built-in 2.5V-power supply circuits and 1.5V-power supply circuits for stepping down the external 3.3 V power supply voltage to 2.5 V or 1.5 V, the sizes of the semiconductor chips will increase. Thereupon, for a semiconductor chip with multiplex power supplies, where a power supply circuit is composed of switching regulators, Japanese Patent Laid-Open Publication No. 2002-83872 proposes a semiconductor chip that has, from among a plurality of switching regulators, only control circuits driven by an external power supply mounted thereon, and adopts a configuration where MOS transistors etc. occupying large areas in the semiconductor chip are provided as external components.

SUMMARY OF THIS INVENTION

With the configuration described in the foregoing publication, it is possible to reduce the size of a semiconductor chip even if it has multiple power supplies. However, because the power supply circuit is not multiplexed, once the power supply circuit has a problem, the semiconductor chip stops operating. In disk array system having semiconductor chips mounted therein, when the semiconductor chips stop operating due to power failures in their power supply circuits, data may be lost. Accordingly, it is essential to multiplex the power supply circuits. However, with a semiconductor chip (LSI) requiring considerable power, the size of its power supply circuit is large, therefore, it is difficult to arrange the entire multiplex power supply circuit on the semiconductor chip (LSI). Also, even if the entire multiplex power supply circuit can be mounted on one semiconductor chip, when a failure occurs in the power supply circuit, the semiconductor chip itself has to be replaced, which raises the cost of recovering from the failure. Considering that power supply circuits are relatively cheaper than semiconductor chips, it is not desirable to replace the semiconductor chips when failures occur in the power supply circuits.

Thereupon, an advantage of this invention is to improve the reliability of a semiconductor integrated circuit device by enabling power to be fed to a semiconductor chip even upon a partial failure in its power supply.

To realize the foregoing advantage, this invention aims to provide a semiconductor integrated circuit that has: a semiconductor chip having a logic circuit; a power supply circuit that receives electric power from an external power supply outside the semiconductor chip and supplies the electric power to the logic circuit; and a power supply control circuit mounted on the semiconductor chip, that transmits/receives information to/from the logic circuit, and controls the power supply circuit. In this semiconductor integrated circuit, the power supply circuit is multiplexed and partially mounted on the semiconductor chip.

In the foregoing semiconductor integrated circuit, because the power supply circuit for supplying power to the semiconductor chip is multiplexed, even when a failure occurs in one of the power supplies, a different normally-operating power supply can supply power to the semiconductor chip, thereby improving the reliability of the LSI chip is improved.

This invention also provides a semiconductor integrated circuit that has: a semiconductor chip having a logic circuit; a power supply circuit that receives electric power from an external power supply outside the semiconductor chip and supplies the electric power to the logic circuit; and a power supply control circuit mounted on the semiconductor chip, that transmits/receives information to/from the logic circuit, and controls the power supply circuit. In this semiconductor integrated circuit, the power supply circuit is configured from: a plurality of voltage conversion circuits arranged outside the semiconductor chip, that convert the voltage applied from the external power supply to a voltage for driving the logic circuit; and a plurality of control circuits mounted on the semiconductor chip, that control the voltage conversion by the respective voltage conversion circuits.

According to this invention, the power can be supplied to the semiconductor chip even upon a partial failure in its power supply circuit, thereby improving the reliability of the semiconductor integrated circuit device.

DETAILED DESCRIPTION OF THIS INVENTION

Figure 1:
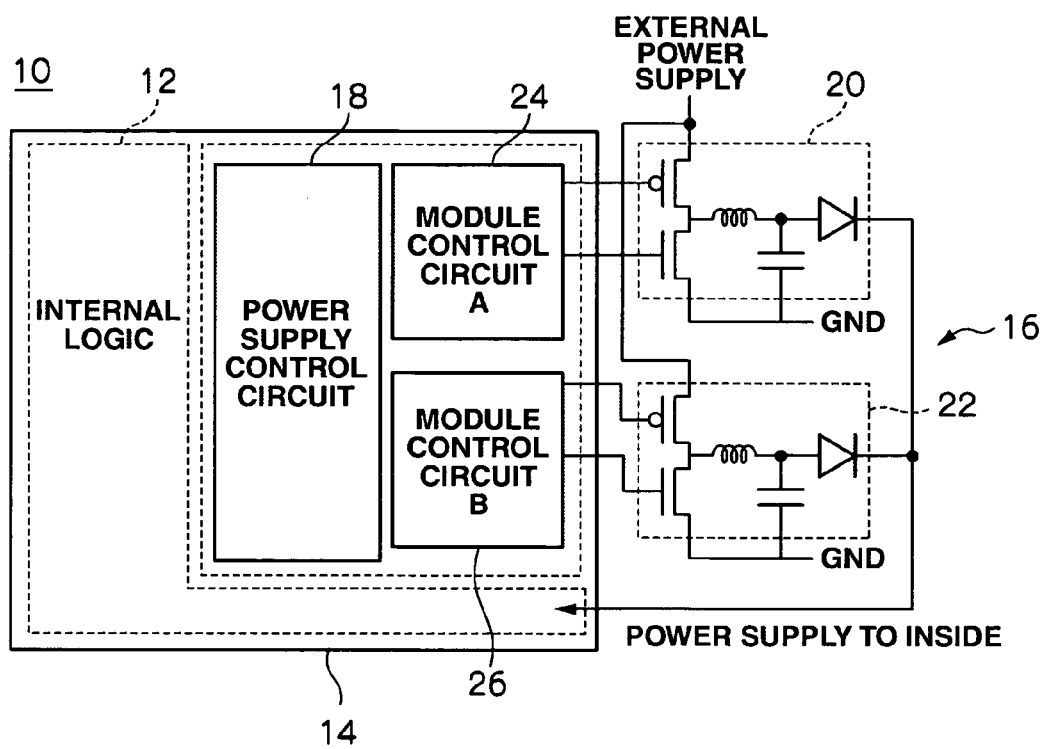
FIG. 1 is a block diagram showing a semiconductor integrated circuit device in embodiment of this invention.
Figure 2:
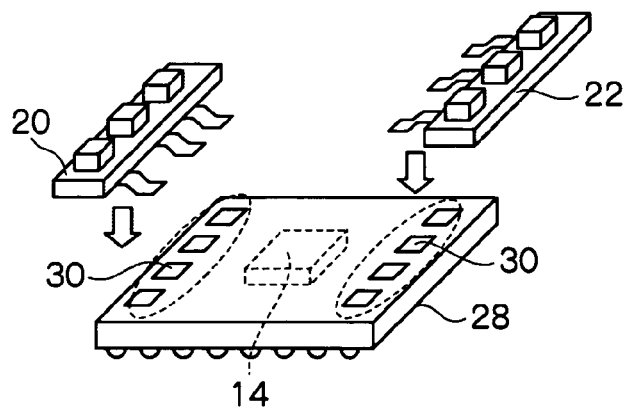
FIG. 2 is an exploded perspective view of the semiconductor integrated circuit device according to this invention.
Figure 3:
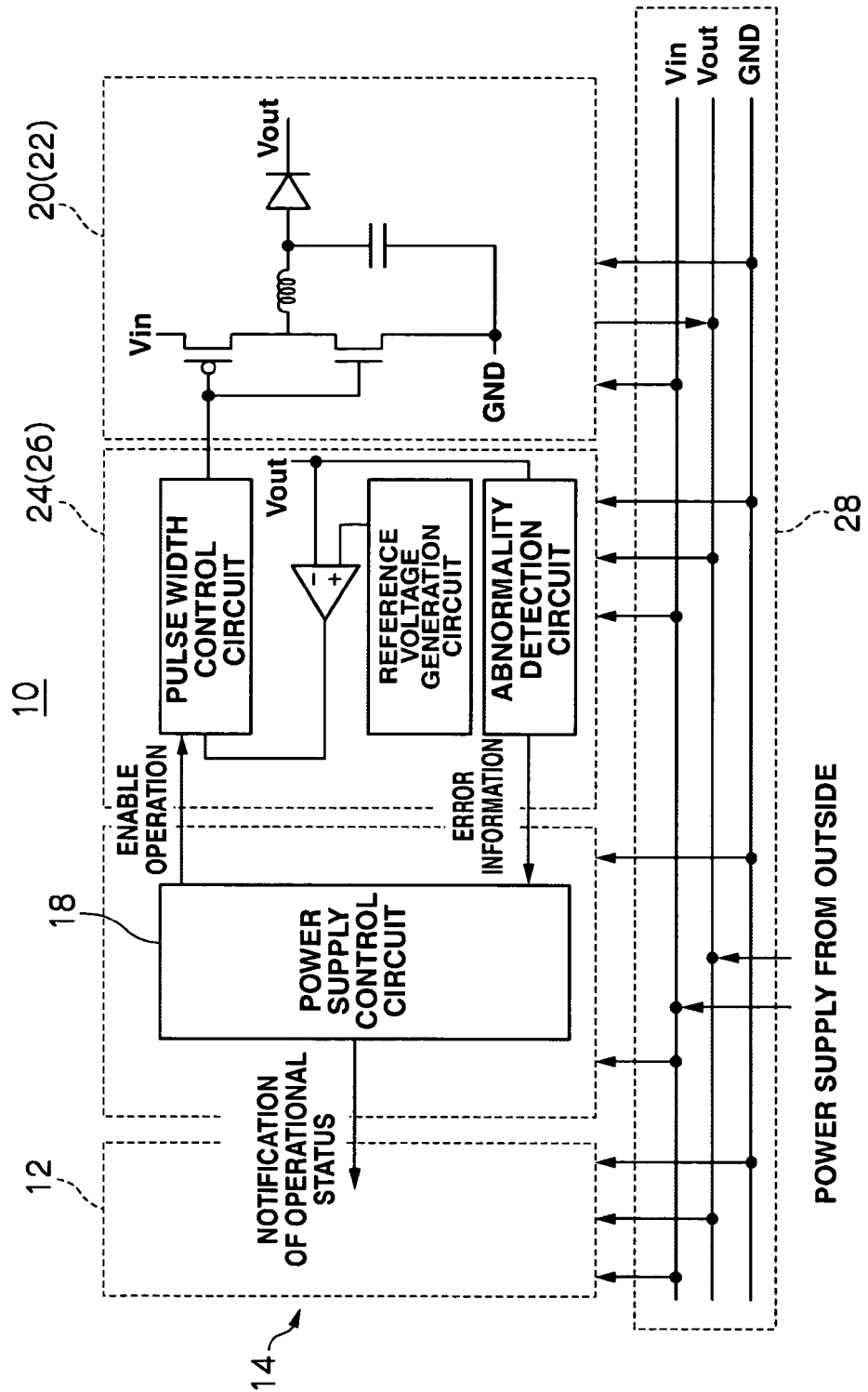
FIG. 3 is a circuit diagram showing a power supply circuit mounted on the semiconductor integrated circuit device according to this invention.

An embodiment of this invention will be explained with reference to the attached drawings. FIG. 1 is a block diagram of a semiconductor integrated circuit device in Example 1 this invention. FIG. 2 is an exploded perspective view of the semiconductor integrated circuit device according to this invention. FIG. 3 is a circuit diagram of a power supply circuit mounted on the semiconductor integrated circuit device according to this invention. A semiconductor integrated circuit device 10 has: an LSI chip 14, serving as a semiconductor chip, including an internal logic 12 configured from a logic circuit; a power supply circuit 16 that receives power supply from an external power supply outside the LSI chip 14 and supplies it to the internal logic 12; and a power supply control circuit 18 that is mounted on the LSI chip 14, transmits and receives information to and from the internal logic 12, and controls the power supply circuit 16. The power supply circuit 16 is multiplexed and partially mounted on the LSI chip 14. An external voltage Vin is applied to the LSI chip 14 and power supply control circuit 18, as well as to the power supply circuit 16.

The power supply circuit 16 is composed of: external modules 20 and 22 that serve as voltage conversion circuits for converting (stepping down) the voltage applied from the external power supply outside the LSI chip, i.e., the external voltage Vin of, e.g. 3.3V to an internal voltage Vout of, e.g., 2.5V or 1.5V for driving the logic circuit; and module control circuits 24 and 26 that are mounted on the LSI chip 14 and serve as control circuits for controlling the voltage conversion by the external modules 20 and 22. On an LSI package 28 having the LSI chip 14 mounted substantially at the center, the external modules 20 and 22 are mounted on both sides of the LSI chip 14 and connected to the module control circuits 24 and 26 on the LSI chip 14 via pads 30.

The internal logic 12 is composed of a logic circuit that receives the external voltage Vin and internal voltage Vout and performs user-designated logical computation; and performs various computation by transmitting and receiving information to and from the power supply control circuit 18.

In order to control the module control circuits 24 and 26 in the power supply circuit 16 with the external voltage Vin, the power supply control circuit 18 outputs, e.g., operation-enabling signals to the module control circuits 24 and 26 to turn on/off the power supply circuit 16. The power supply control circuit 18 also monitors the status of the power supply circuit 16 and outputs the information for the operational status of the power supply circuit 16 to the internal logic 12. For example, when error information is input from the module control circuit 24 or 26, the power supply control circuit 18 outputs an abnormality detection signal indicating the abnormality in the power supply circuit 16 to the internal logic 12, illuminates an LED (not shown in the drawing), and generates an alarm for prompting component replacement.

Each of the module control circuits 24 and 26 has a pulse width control circuit 32, comparator 34, reference voltage generation circuit 36, and abnormality detection circuit 38 and is driven by the external voltage Vin. When it receives an operation-enabling signal from the power supply control circuit 18, it compares, using the comparator 34, the reference voltage generated by the reference voltage generation circuit 36, e.g. 1.5V, and the internal voltage Vout output from the external modules 20 and 22; and outputs a switching signal having a pulse width set based on the comparison result to the external modules 20 and 22 from the pulse width control circuit 32. In other words, each module control circuit (24, 26) sets a duty ratio for matching the reference voltage and the internal voltage Vout, and generates a switching signal having the pulse width set based on the duty ratio. The module control circuits 24 and 26 also monitor the statuses of the external modules 20 and 22 respectively with their abnormality detection circuits 38 and when an abnormality such as over-voltage, under-voltage, over-current, or abnormal temperature occurs, they output error information to the power supply control circuit 18.

Each of the external modules 20 and 22 is composed of a PMOS transistor 40, NMOS transistor 42, coil 44, condenser 46, and diode 48. The PMOS transistor 40 and NMOS transistor 42 go on/off alternately in response to the switching signals from the module control circuits 24 and 26. The external modules 20 and 22 step down the external voltage Vin to convert it to the internal voltage Vout; and supply the internal voltage Vout to the internal logic 12.

In Example 1, as the power supply circuit 16 is duplexed, the external module and the module control circuit are also duplexed respectively (i.e., external modules 20, 22 and module control circuits 24, 26). Accordingly, even when a failure occurs in a part of the power supply circuit 16, i.e., in the external module 20 or 22 or module control circuit 24 or 26, the internal logic 12 still can be supplied with voltage from either normally-operating external module. Consequently, the reliability of the semiconductor integrated circuit device 10 is improved.

Figure 4:
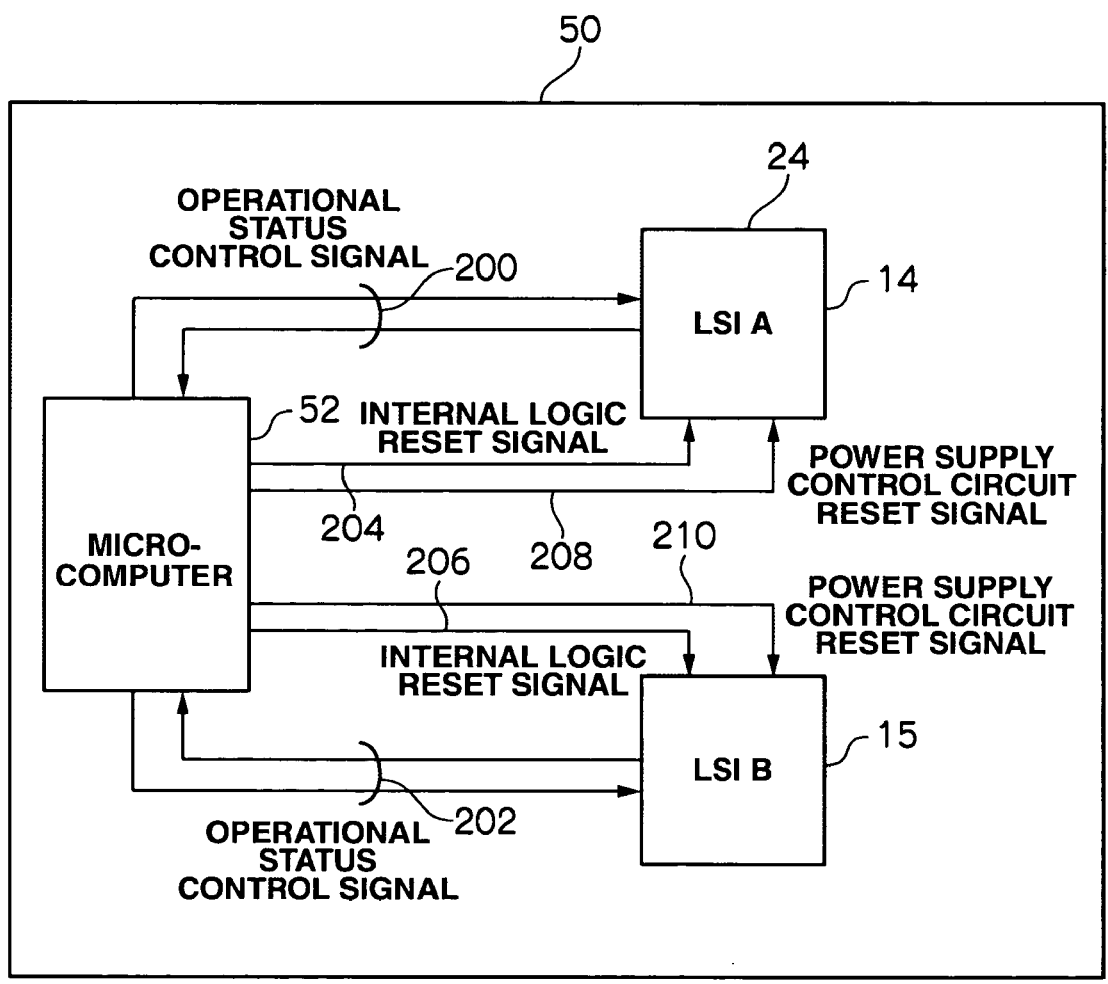
FIG. 4 is a block diagram showing a semiconductor integrated circuit device in embodiment 2 of this invention.
Figure 5:
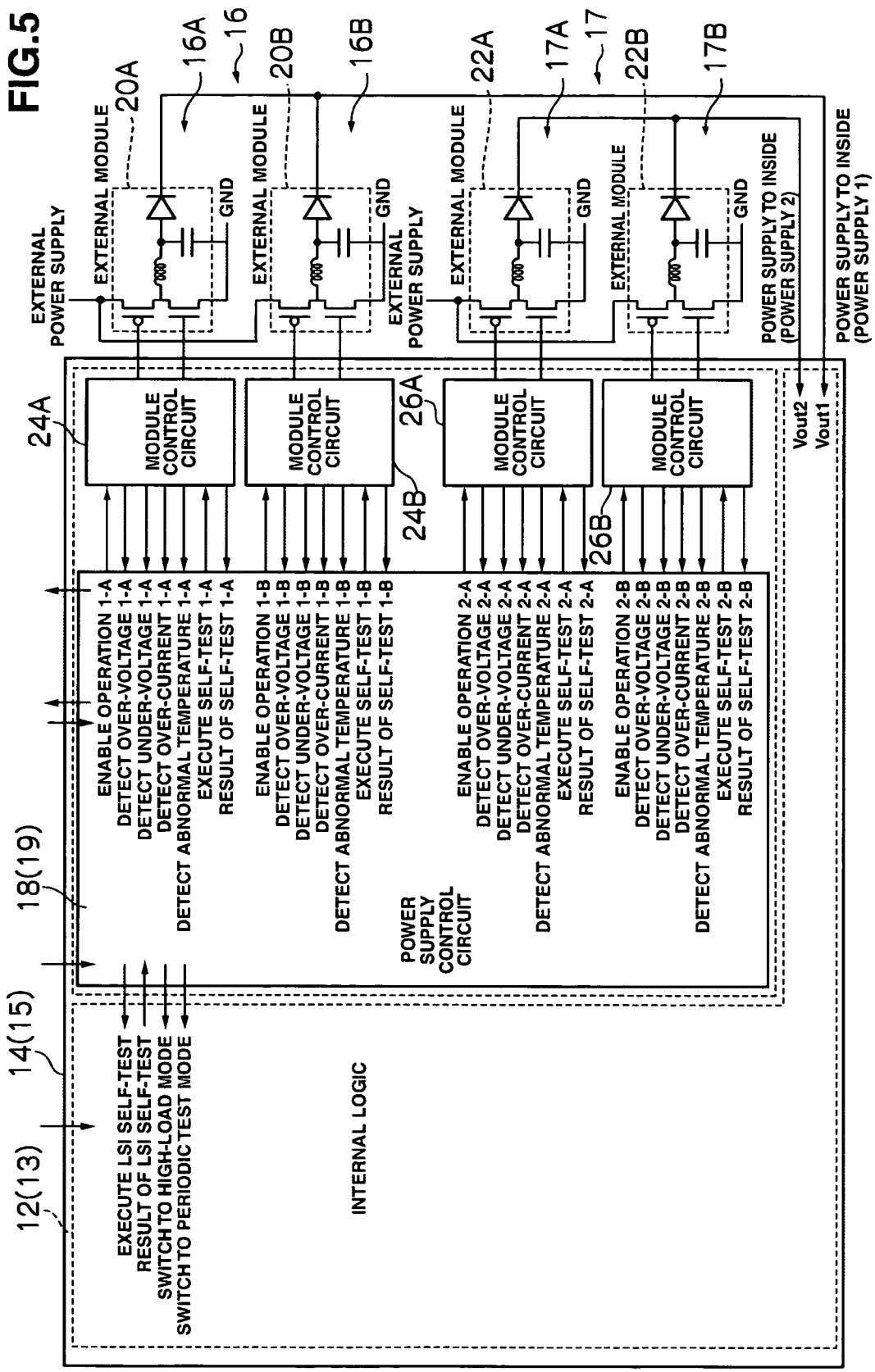
FIG. 5 is a block diagram showing an LSI chip and external modules in Example 2 of this invention.

Example 2 of this invention will be explained with reference to FIGS. 4 and 5. In this example, LSI chips (semiconductor chips) 14 and 15 and an external microcomputer 52 are mounted on a single substrate 50 and information is transmitted between the LSI chips 14 and 15 and the microcomputer 52 using signals such as operation status control signals 200 and 202, internal logic reset signals 204 and 206, and power supply control circuit reset signals 208 and 210. Power supply circuits 16 and 17 are each multiplexed, i.e., there are power supply circuits 16A, 16B and power supply circuits 17A, 17B. The power supply circuit 16A has an external module 20A and module control circuit 24A; the power supply circuit 16B has an external module 20B and module control circuit 24B; the power supply circuit 17A has an external module 22A and module control circuit 26A; and the power supply circuit 17B has an external module 22B and module control circuit 26B. The LSI chips 14 and 15 have internal logics 12 and 13, and power supply control circuits 18 and 19, mounted thereon respectively. Each LSI chip also has module control circuits 24A, 24B, 26A, 26B mounted thereon. When the power supply control circuit 18 or 19 detects an abnormality in the module control circuit 24A, 24B, 26A or 26B or external module 20A, 20B, 22A or 22B, it stores information for the abnormality in its register or RAM (not shown in the drawing). The microcomputer 52 manages the operation statuses of the LSI chips 14 and 15—whether they are operating or whether operations have been stopped due to power failures.

Incidentally, the external modules 20A, 20B, 22A and 22B in this example are configured from the same components as the foregoing external modules 20 and 22. The module control circuits 24A, 24B, 26A and 26B have the same functions as the foregoing module control circuits 24 and 26; however, the reference voltage of the module control circuits 24A and 24B and the reference voltage of the module control circuits 26A and 26B are set to different values. For example, the reference voltage of the module control circuits 24A and 24B is set to 2.5V and the reference voltage of the module control circuits 26A and 26B is set to 1.5V. In this case, the external modules 20A and 20B output an internal voltage Vout 1 of 2.5V and the external modules 22A and 22B output an internal voltage Vout 2 of 1.5V.

When the microcomputer 52 is powered on, it outputs: internal logic reset signals 204 and 206 to the internal logics 12 and 13 on the LSI chips (semiconductor chips) 14 and 15, respectively; and power supply control circuit reset signals 208 and 210 to the power supply control circuits 18 and 19 on the same in order to prevent malfunctions in the internal logics 12 and 13 and power supply control circuits 18 and 19 when these components are powered on. After that, the microcomputer 52 cancels the respective reset signals and then starts the power supply (i.e., the power supply circuits 16 and 17). The microcomputer 52 also receives from the respective LSI chips 14 and 15 operational status control signals 200 and 202 including signals indicating whether there is an abnormality in the power supply and whether the LSI chips 14 and 15 are in operable states; outputs operational status control signals 200 and 202 including signals designating reset cancellation and execution of periodic tests to the respective LSI chips 14 and 15; and notifies each of the LSI chips 14 and 15 respectively whether the other LSI chip is in an operable state or not. For example, it is assumed that, when transmitting data between the LSI chips 14 and 15 via the microcomputer 52, the LSI chip 14 is already turned on and in a state able to transmit data. Here, if the LSI chip 15 is also already turned on and in a state able to transmit data, they can transmit data to each other. However, if the LSI chip 15 is not operating due to a problem in its power supply, they cannot perform the data transmission. Accordingly, it is configured so that the LSI chip 14 checks whether the LSI chip 15 is operating or not before transmitting the data to the LSI chip 15.

When any of the power supply control circuits 18 and 19, module control circuits 24A, 24B, 26A, and 26B and external modules 20A, 20B, 22A and 22B outputs an abnormality alarm signal 212 indicating an abnormality in the component, the microcomputer 52 illuminates, from among the LEDs (not shown in the drawing) provided corresponding to the respective components, the LED corresponding the alarm-outputting component (circuit) so that the user can know which component has a problem. Incidentally, instead of illuminating an LED to inform of an abnormality, it is also possible to have a configuration where, when a failure occurs in a component, the information for identifying the faulty component is stored in the register of the microcomputer 52 so that, the microcomputer 52 can read the content in the registry when a power failure or similar occurs.

Entire Processing Controlled by Microcomputer

The operations in Example 2 will be explained based on the flowchart shown in FIG. 6. Under the control of the microcomputer 52, when power supply from the external power supply to the LSI chips 14, 15 and power supply circuits 16 and 17 is started, the power supply control circuits 18 and 19 and internal logics 12 and 13 are put in their reset states (step S1). The microcomputer 52 then cancels the reset states of the power supply control circuits 18 and 19 (step S2); and has the power supply circuits 16 and 17, power supply control circuits 18 and 19 and module control circuits 24A, 24B, 26A and 26B perform self-tests respectively (step S3). If any result of the self-tests by the respective circuits is 'error' (error end), the microcomputer 52 proceeds to step S10 where it stops the operation of the internal logic 12 or 13 relevant to the faulty circuit. Whereas, if all the results are normal, the power supply circuits 16 and 17 are started (step S4). If the start-up of the power supply circuits 16 or 17 fails (error end), the microcomputer 52 proceeds to step S10, whereas if the start-up of both power supply circuits 16 and 17 is successful (normal end), the microcomputer 52 cancels the reset states of the internal logics 12 and 13 (step S5) and has the internal logics 12 and 13 perform self-tests respectively (LSI self-test) (step S6).

If an abnormality is detected in any part of the internal logic 12 or 13 in the self-tests y the internal logic 12 and 13, the microcomputer 52 proceeds to step S10 where it stops the operation of the faulty internal logic. Whereas, if an abnormality is detected in any part of the power supply for the internal logic 12 or 13, the microcomputer 52 proceeds to step S8 where it replaces the faulty external module 20A, 20B, 22A or 22B. If all the results of the self-tests by the internal logics 12 and 13 are normal, the internal logics 12 and 13 execute normal operations (step S7) and when an error occurs during their operations (error end), the microcomputer 52 proceeds to step S8. Also, during the operations, when the microcomputer 52 makes requests to the internal logics 12 and 13 to perform periodic tests, the internal logics 12 and 13 perform the periodic tests and when the results are normal, the microcomputer 52 returns to step S7, whereas, if the any of the results is 'error', the microcomputer 52 executes power supply switching processing (step S8).

When the processing to switch, between two power supply circuits, from the faulty power supply circuit to the other normally-operating power supply circuit completes in a normal state, the microcomputer 52 returns to step S7. Whereas, if an error occurs during the processing, the microcomputer 52 stops the operation of the internal logic 12 or 13 relevant to the faulty power supply (step S10). After that, the microcomputer 52 returns to step S2 where it restarts the internal logic relevant to the faulty power supply and, if the restarted internal logic operates normally, it means that the internal logic is in a normal operational state. In this case, the microcomputer 52 judges that the problem was an accident caused by noise or similar, and that it was not a faulty component. Whereas, if the restarted internal logic again has a problem and stops operating due to a power failure etc., the microcomputer 52 judges that the problem is a faulty component and therefore returns to step S2 where it waits for the component to be replaced (step S11).

Self-Test Processing for Circuits

Figure 7:
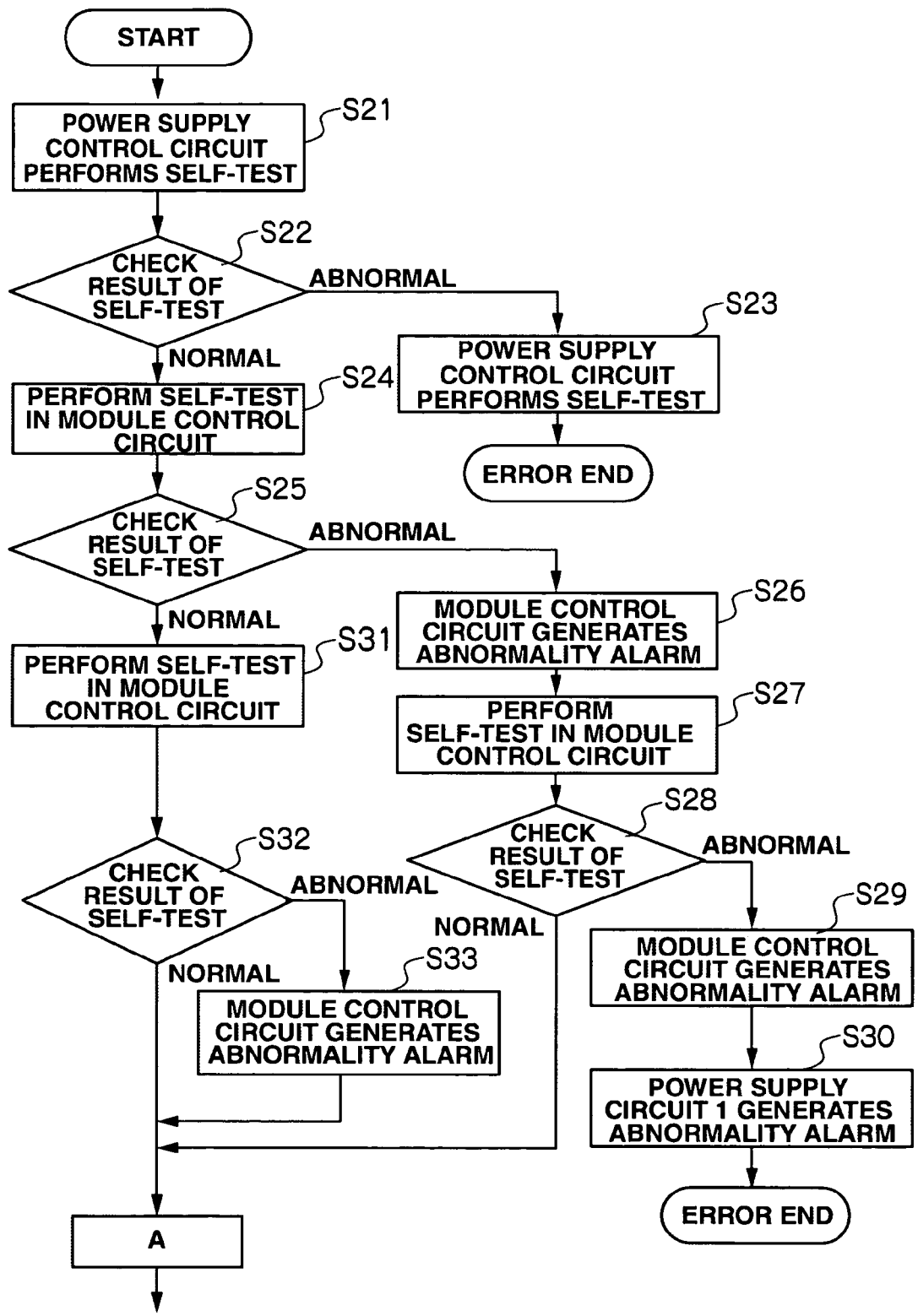
FIG. 7 is a flowchart explaining self-test processing in the electric circuit.
Figure 8:
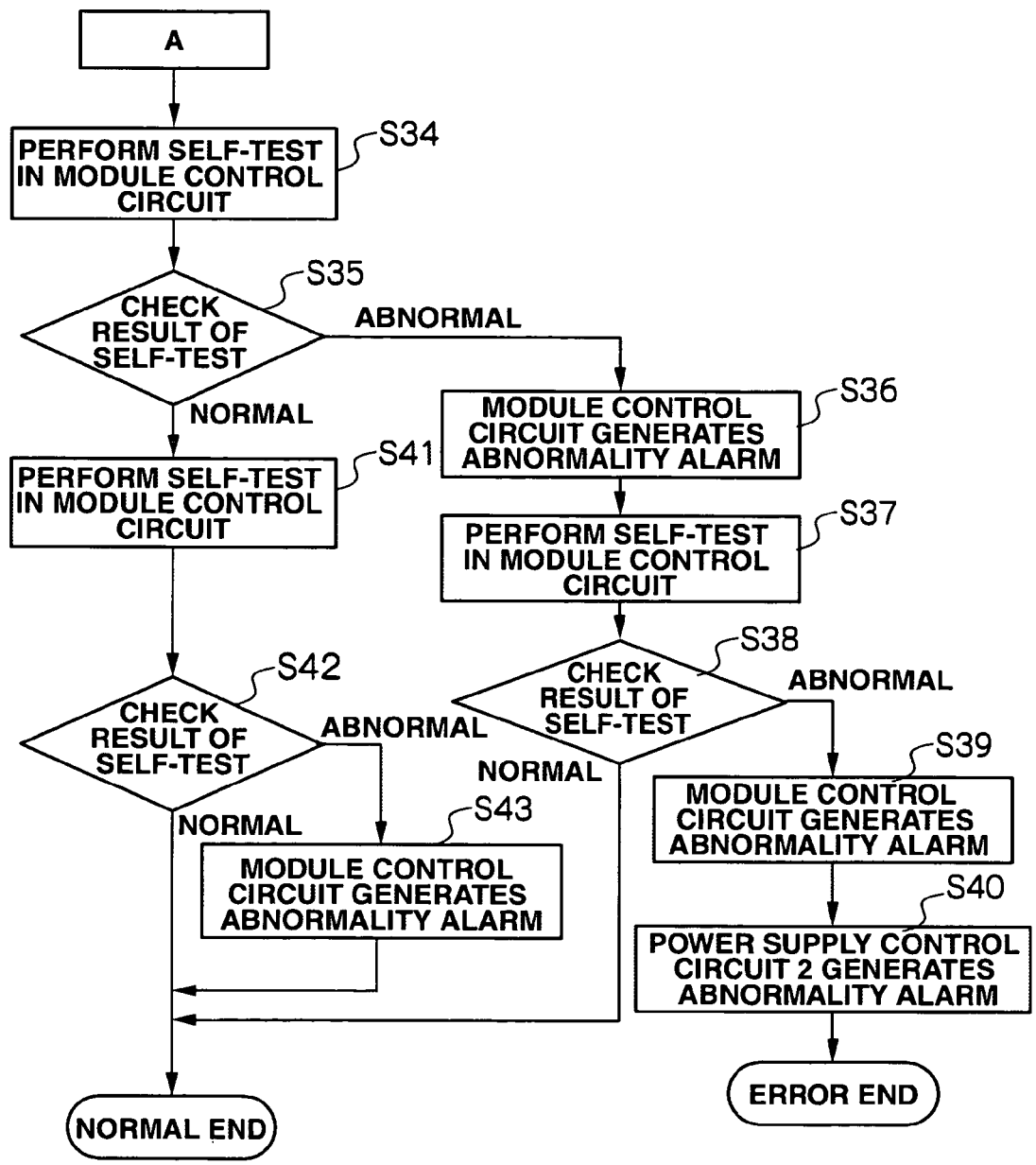
FIG. 8 is a flowchart explaining self-test processing in the electric circuit.

The content of self-tests processing performed by the respective circuits in step S3 will be specifically explained with reference to the flowcharts shown in FIGS. 7 and 8. Incidentally, in Example 2, the internal logics 12 and 13, power supply control circuits 18, 19, and module control circuits 24A, 24B, 26A, and 26B have built-in self-test (BIST) functions so that they can perform self-tests to identify a faulty part upon the occurrence of an abnormality. Here, in the explanation below, self-tests by the power supply control circuits 18 and 19 and module control circuits 24A, 24B, 26A and 26B will be explained.

When the power supply control circuit 18 executes a self-test as directed by the microcomputer 52 (step S21), it checks the test result, judges whether it is in a normal or abnormal state (step S22) and, if the result is abnormal, generates an abnormality alarm and terminates the self-test in 'error end' (step S23). Whereas, if the result is normal, the microcomputer 52 directs the module control circuit 24A to perform a self-test (step S24). After the self-test, the module control circuit 24A checks the test result, judges whether it is in a normal or abnormal state (step S25) and, if the result is abnormal, generates an abnormality alarm (step S26). Then, the microcomputer 52 directs the module control circuit 24B to perform a self-test (step S27). After the self-test, the module control circuit 24B checks the test result, judges whether it is in a normal or abnormal state (step S28) and, if the result is abnormal, generates an abnormality alarm (step S29). Here, the power supply circuit 16 also generates an alarm indicating its abnormality (step S30). The microcomputer 52 ends the self-test processing in 'error end'.

Meanwhile, if the test result of the module control circuit 24A is normal in step S25, the module control circuit 24B then performs a self-test as directed by the microcomputer 52 (step S31). After the self-test, the module control circuit 24B checks the test result, judges whether it is in a normal or abnormal state (step S32) and, if the result is abnormal, generates an abnormality alarm (step S33). Then, the microcomputer 52 directs the module control circuit 26A to perform a self-test (step S34). After the self-test, the module control circuit 26A checks the test result, judges whether it is in a normal or abnormal state (step S35) and, if the result is abnormal, generates an abnormality alarm (step S36). Then, the microcomputer 52 directs the module control circuit 26B to perform a self-test (step S37). After the self-test, the module control circuit 26B checks the test result, judges whether it is in a normal or abnormal state (step S38) and, if the result is abnormal, generates an abnormality alarm (step S39). Here, the power supply circuit 17 also generates an alarm indicating its abnormality (step S40). Then, the microcomputer 52 ends the self-test processing in 'error end.'

Meanwhile, if the result of the self-test by the module control circuit 26A is normal in step S35, the microcomputer 52 directs the module control circuit 26B to perform a self-test (step S41). After the self-test, the module control circuit 26B checks the test result, judges whether it is in a normal or abnormal state (step S42) and, if the result is abnormal, generates an abnormality alarm (step S43). Whereas, if the test result is normal, the microcomputer 52 ends the self-test processing in this routine in 'normal end.'

Start-Up Processing for Circuits

Figure 9:
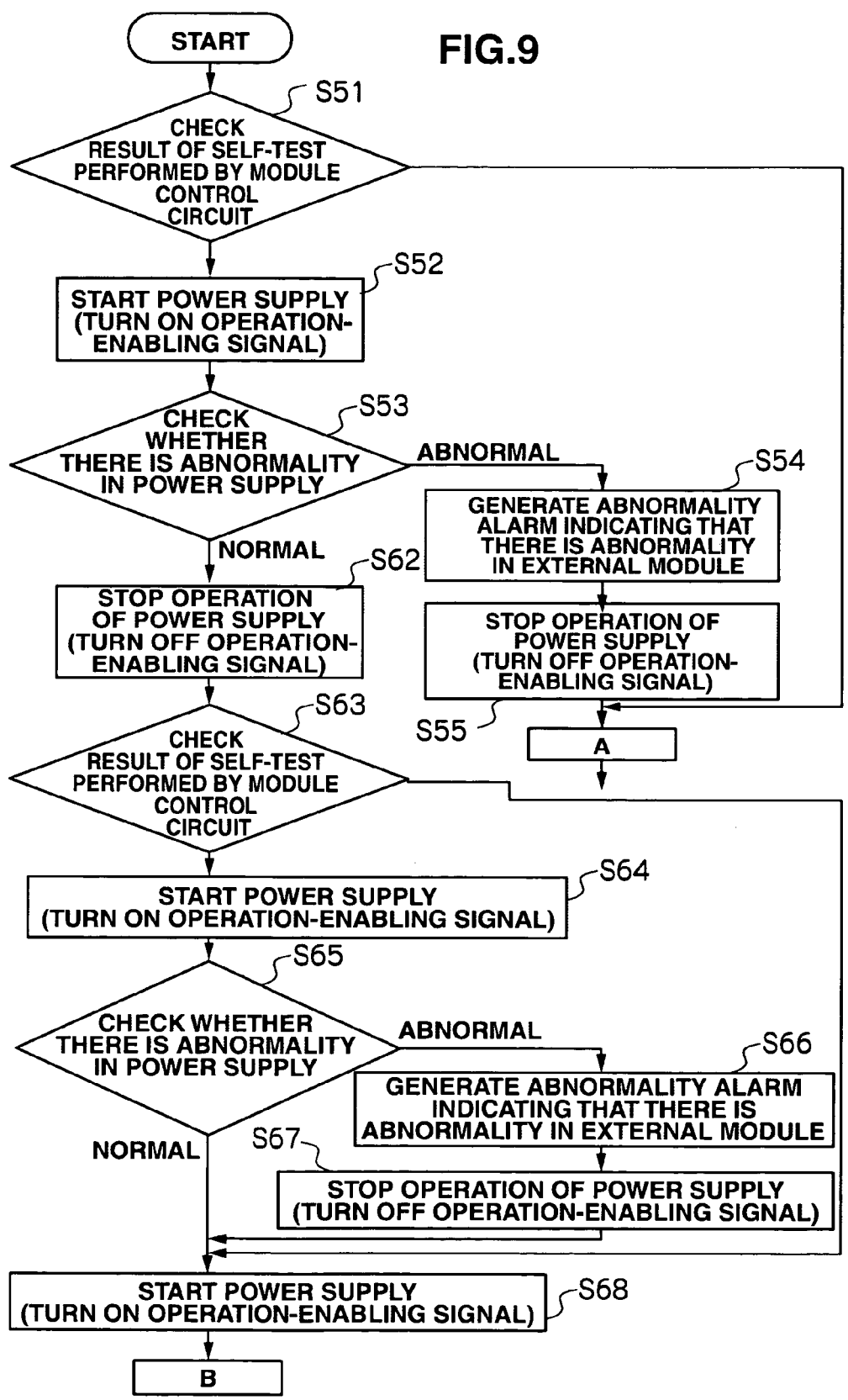
FIG. 9 is a flowchart explaining start-up processing in the electric circuit.
Figure 10:
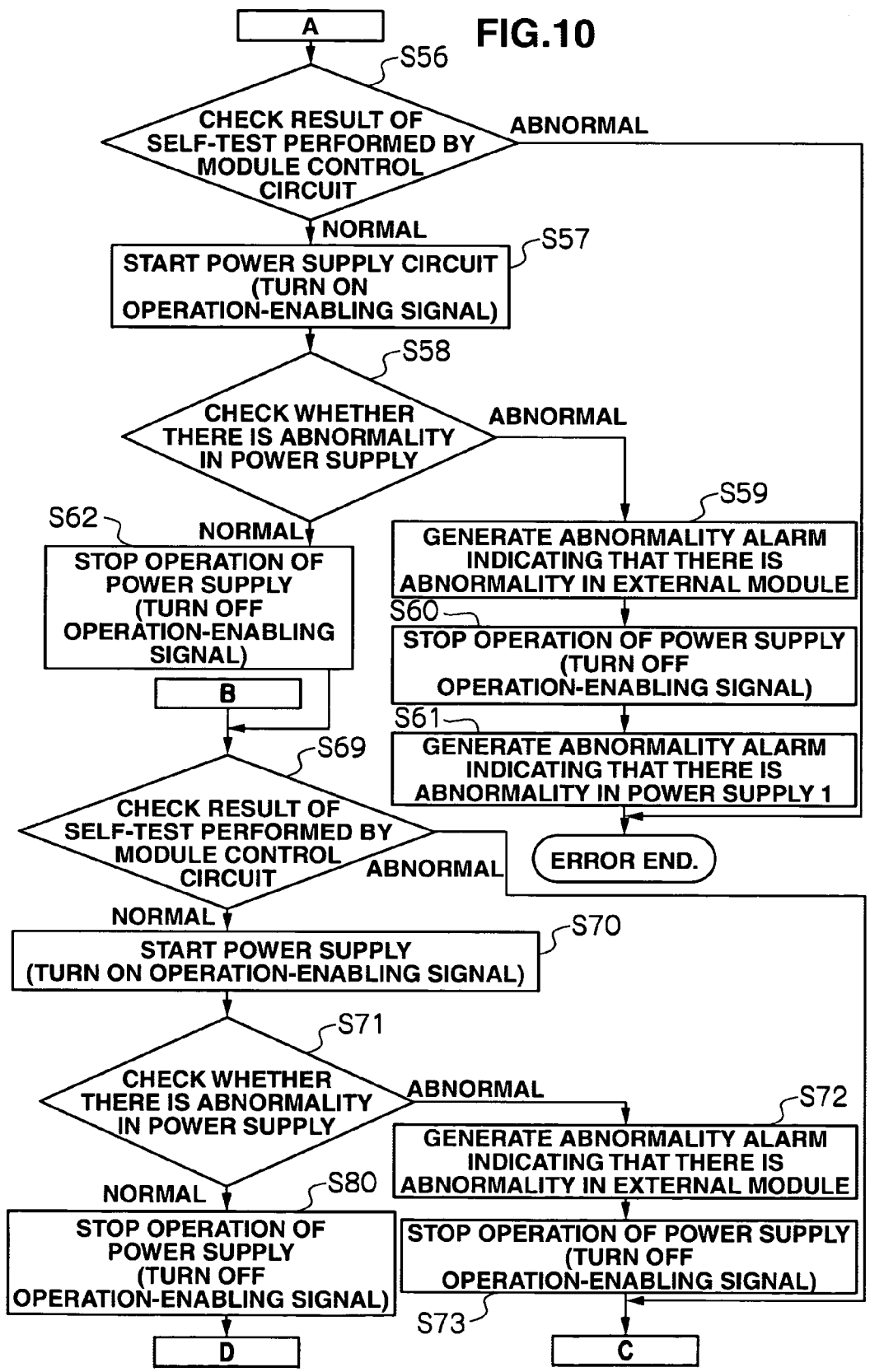
FIG. 10 is a flowchart explaining start-up processing in the electric circuit.
Figure 11:
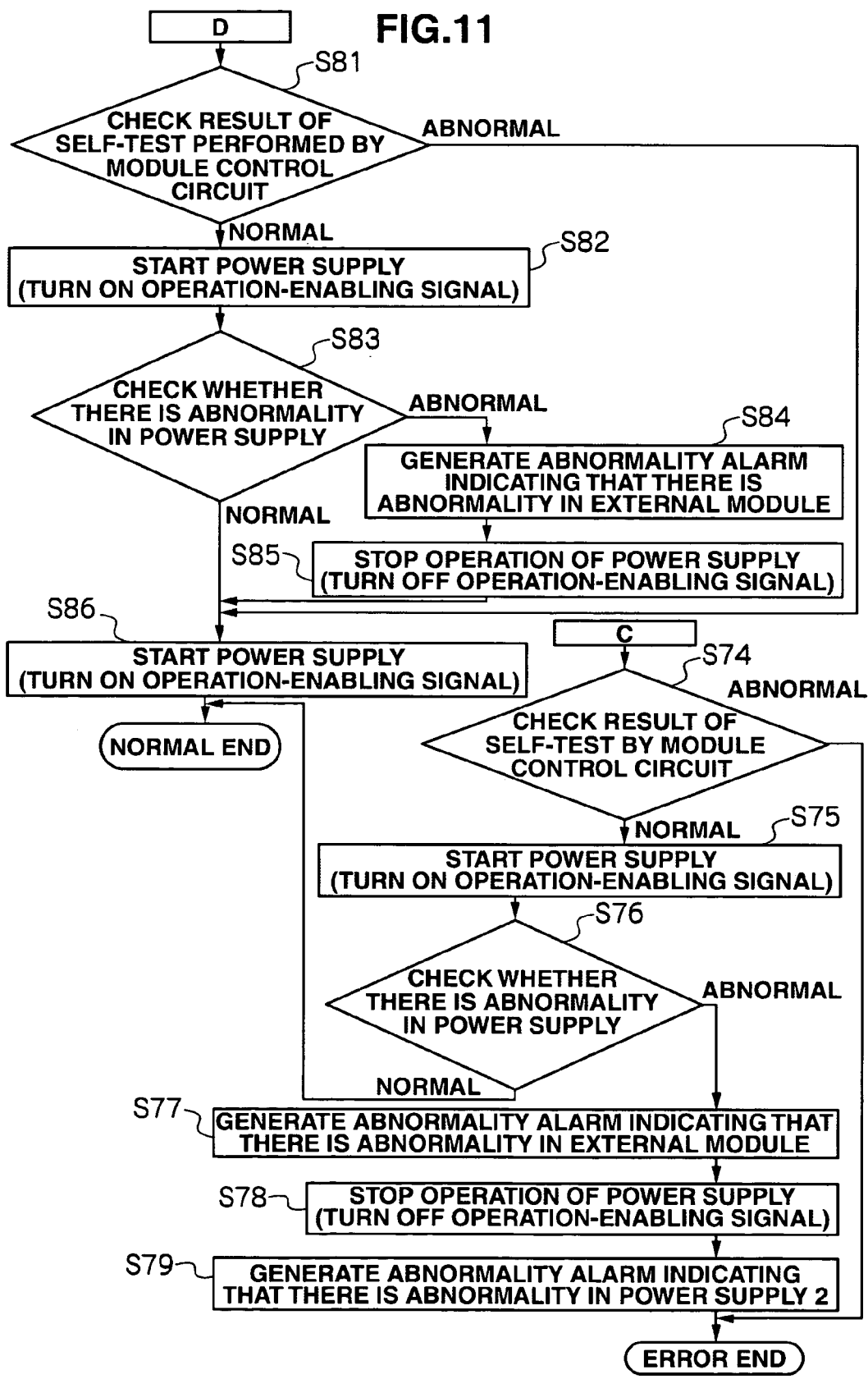
FIG. 11 is a flowchart explaining start-up processing in the electric circuit.

The content of start-up processing performed for the circuits in step S4 will be explained in detail with reference to the flowcharts shown in FIGS. 9 and 11. Example 2 will be explained for the case where the power supply circuit 16 is started up first and the power supply circuit 17 is then started. First, as directed by the microcomputer 52, the power supply control circuit 18 monitors the state of the module control circuit 24A and judges whether the module control circuit 24A is in a normal or abnormal state (step S51) and, if the module control circuit 24A is in a normal state, it outputs an operation-enabling signal to the module control circuit 24A and starts the module control circuit 24A (i.e., start-up of the power supply circuit 16A) (step S52), and judges whether there is an abnormality in the relevant power supply (i.e., the external module 20A) (step S53).

Here, if any one of the abnormalities including over-voltage, under-voltage, over-current, and abnormal temperature is detected in the power supply (i.e., the external module 20A), the power supply control circuit 18 generates an abnormality alarm indicating that there is an abnormality in the external module 20A (step S54), stops outputting the operation-enabling signal to the module control circuit 24A, stops the operation of the power supply circuit 16A (step S55), monitors the state of the module control circuit 24B, judges whether the module control circuit 24B is in a normal or abnormal state (step S56), and if the module control circuit 24B is in a normal state, outputs an operation-enabling signal to start the module control circuit 24B (step S57), and judges whether there is an abnormality in the relevant power supply (i.e., the external module 20B) (step S58). Here, if any one of the abnormalities including over-voltage, under-voltage, over-current, and abnormal temperature is detected in the relevant power supply (i.e., the external module 20B), the power source control circuit 18 generates an abnormality alarm indicating that the external module 20B has an abnormality (step S59), stops outputting the operation-enabling signal to the module control circuit 24B, stops the operation of the power supply circuit 16B (step S60), generates an abnormality alarm indicating that both the external modules 20A and 20B have abnormalities (step S61), and ends the start-up processing in 'error end.' Incidentally, if the relevant power supply is normal, the microcomputer 52 proceeds to step S69.

Meanwhile, if the relevant power supply (i.e., the external module 20A) is judged normal in step S53, the power supply control circuit 18 stops outputting the operation-enabling signal to the module control circuit 24A to temporarily stop the operation of the power supply circuit 16A (step S62), monitors the state of the module control circuit 24B, judges whether the module control circuit 24B is in a normal or abnormal state (step S63) and, if the module control circuit 24B is in a normal state, it outputs an operation-enabling signal to the module control circuit 24B to start the module control circuit 24B (i.e., start-up of the power supply circuit 16B) (step S64), and judges whether there is an abnormality in the relevant power supply (i.e., the external module 20B) (step S65).

Here, if any one of the abnormalities including over-voltage, under-voltage, over-current, and abnormal temperature is detected in the relevant power supply (i.e., the external module 20B), the power supply control circuit 18 generates an abnormality alarm indicating that the external module 20B has an abnormality (step S66), stops outputting the operation-enabling signal to the module control circuit 24B, stops the operation of the power supply circuit 16B (step S67), outputs an operation-enabling signal to the module control circuit 24A to restart it (i.e., start-up of the power supply circuit 16A) (step S68), just as when the external module 20B is in a normal state, monitors the state of the module control circuit 26A, judges whether the module control circuit 26A is in a normal or abnormal state (step S69) and, if it is in a normal state, the power supply control circuit 18 outputs an operation-enabling signal to the module control circuit 26A to start it (i.e., start-up of the external module 22A in the power supply circuit 17A (step S70), and judges whether there is an abnormality in the relevant power supply (i.e., the external module 22A) (step S71).

Here, if any one of the abnormalities including over-voltage, under-voltage, over-current, and abnormal temperature is detected in the relevant power supply (i.e., the external module 22A), the power supply control circuit 18 generates an abnormality alarm indicating that the external module 22A has an abnormality (step S72), stops outputting the operation-enabling signal to the module control circuit 26A, stops the operation of the external module 22A in the power supply circuit 17A (step S73), monitors the state of the module control circuit 26B, judges whether it is a normal state or abnormal state (step S81) and, if it is in a normal state, the power supply control circuit 18 outputs an operation-enabling signal to the module control circuit 26B to start it (step S82), and judges whether there is an abnormality in the relevant power supply (i.e., the external module 22B) (step S83). Here, if any one of the abnormalities including over-voltage, under-voltage, over-current, and abnormal temperature is detected in the relevant power supply (i.e., the external module 22B), the power supply control circuit 18 generates an abnormality alarm indicating that the external module 22B has an abnormality (step S84), stops outputting the operation-enabling signal to the module control circuit 26B to stop the operation of the power supply circuit 17B (step S85), outputs an operation-enabling signal to the module control circuit 24A to restart it (i.e., start-up of the power supply circuit 16A, just as when the external module 22B is in a normal state. Then the microcomputer 52 ends the start-up processing in 'normal end.'

Self-Test Processing for LSI

Figure 12:
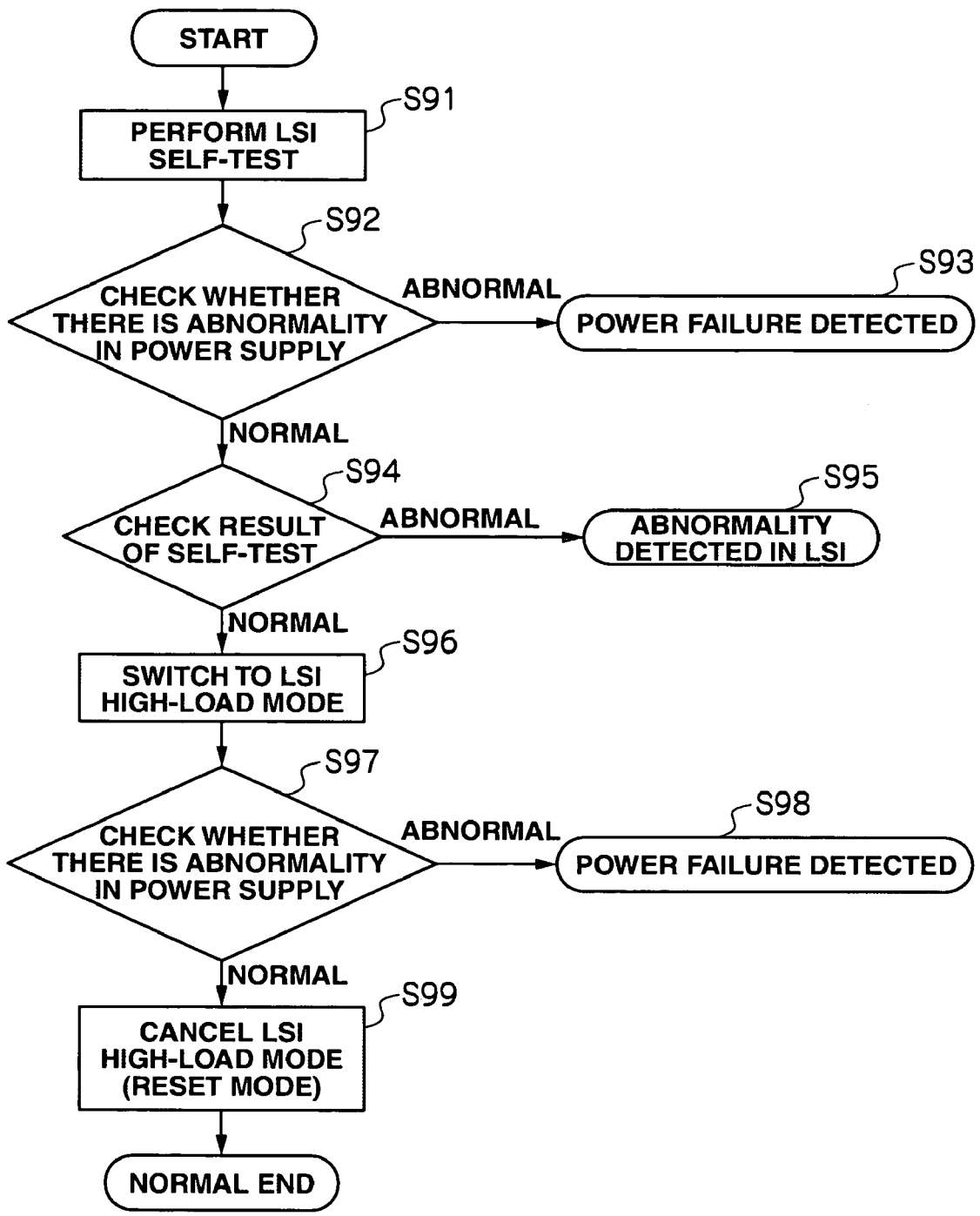
FIG. 12 is a flowchart explaining self-test processing in LSI.

The self-test processing performed in the internal logic 12 will be explained with reference to the flowchart shown in FIG. 12. First, when the microcomputer 52 directs the power supply control circuit 18 to command the internal logic 12 to perform LSI self-test processing, the internal logic 12 performs an LSI self-test (step S91) and judges whether there is an abnormality in the relevant power supplies (step S92). Here, if any one of the abnormalities including over-voltage, under-voltage, over-current, and abnormal temperature is detected in at least one of the external modules in the power supply circuits 16 and 17, the internal logic 12 outputs a power supply abnormality detection signal (step S93), whereas, if when the power supplies circuits 16 and 17 are in normal states, the internal logic 12 judges whether the test result is normal or abnormal, and outputs the result to the power supply control circuit 18 (step S94). If the test result is abnormal, the power supply control circuit 18 outputs an LSI abnormality detection signal to the microcomputer 52 (step S95), whereas if the result is normal, it switches the mode of the internal logic 12 to an LSI high-load mode (step S96), and the internal logic 12 judges whether there is an abnormality in the relevant power supply (step S97). Here, if any one of the abnormalities including over-voltage, under-voltage, over-current, and abnormal temperature is detected in at least one of the external modules in the power supply circuits 16 and 17, the internal logic 12 outputs a power supply abnormality detection signal (step S98). Whereas, if the relevant power supply is in a normal state, the power supply control circuit 18 cancels the LSI high-load mode and resets the internal logic 12 (step S99). Then, the microcomputer ends the processing.

Thus, with a self-test performed at power-on, whether there is an abnormality in the internal logic 12 can be judged. Also, conventionally, because the internal logic 12 does not perform any load-imposing operations (e.g., data transfer) immediately after power-on, it was impossible to judge whether power could be supplied from the power supply circuits 16 and 17 to the internal logic 12 if the internal logic 12 was under loaded conditions. However, in this example, because the internal logic 12 is made to operate in the LSI high-load mode, it is possible to check whether power is being supplied from the power supply circuits 16 and 17 to the internal logic 12.

Power Supply Switching Processing

Figure 13:
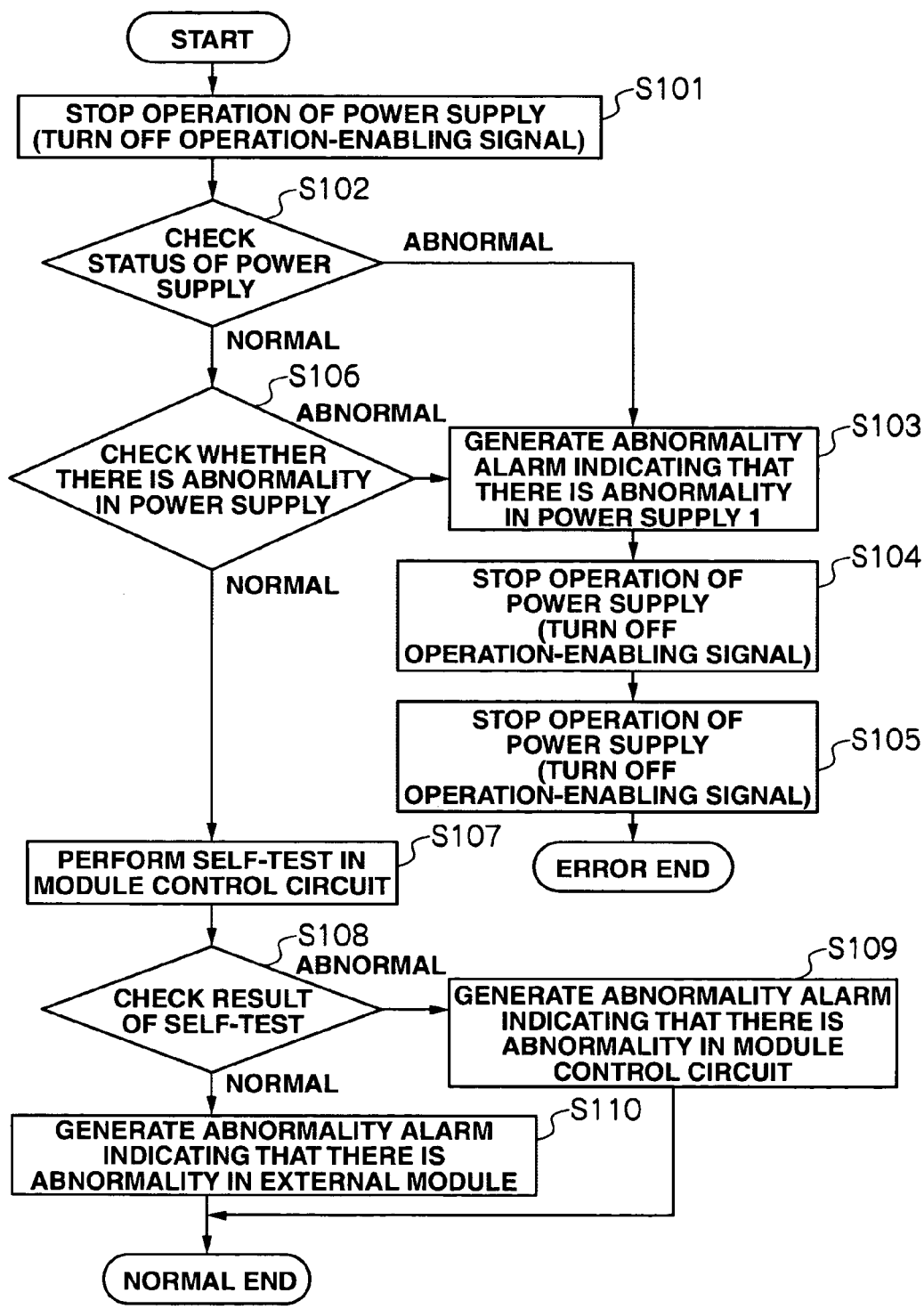
FIG. 13 is a flowchart explaining power supply switching processing.

The content of the power supply switching processing performed in step S8 will be explained in detail with reference to the flowchart shown in FIG. 13. In Example 2, explanations will be given for the case where an abnormality (over-voltage, under-voltage, over-current, or abnormal temperature) is detected in the external module 20A in the power supply circuit 16A, however, the same processing is performed when an abnormality is detected in other power supply circuits.

First, when an abnormality is detected in the external module 20A in the power supply circuit 16A, the power supply control circuit 18 stops outputting the operation-enabling signal to the power supply circuit 16A to stop the operation of the power supply circuit 16A (step S101). When the operation of the power supply circuit 16A is stopped, it is necessary to supply power to the internal logic 23 from the power supply circuit 16B. Accordingly, in order to check the state of the power supply circuit 16B, the power supply control circuit 18 first judges whether the power supply circuit 16B is in a normal or abnormal state (step S102) and, if an abnormality is detected the power supply circuit 16B, it generates an abnormality alarm indicating that both external modules 20A and 20B in the power supply circuit 16 have abnormalities (step S103), stops outputting the operation-enabling signals to both module control circuits 26A and 26B to stop the operation of the power supply circuit 17 (step S104), stops outputting the operation-enabling signal to the module control circuit 24B to stop the operation of the power supply circuit 16B (step S105), and terminates the processing in 'error end' by concluding that both power supply circuits 16A and 16B have abnormalities and are unable to supply power to the internal logic 12. In this case, because both circuits 16A and 16B have problems, the internal logic 12 is restarted to perform a self-test and search for a faulty part. In other words, the internal logic 12 is restarted because if the foregoing abnormalities are caused by incidental noise in the power supply circuits, the power supply circuits 16A and 16B may operate normally after the restart. If so, the internal logic 12 continues to operate because there is no problem in the power supply circuit 16A or 16B.

Meanwhile, if the power supply circuit 16B is judged normal in step S102, the power supply control circuit 18 judges whether the power supply circuit 16 is in a normal or abnormal state (step 106), and if it is in an abnormal state, the power supply control circuit 18 proceeds to step S103 and generates an abnormality alarm and executes steps S104 and 105. Whereas, if the power supply circuit 16 is in a normal state, the power supply control circuit 18 directs the module control circuit 24A to perform a self-test (step S107). The module control circuit 24A then performs a self-test and the power supply control circuit 18 checks the test result and judges whether the result is normal or abnormal (step S108). If the result is abnormal, the power supply control circuit 18 generates an abnormality alarm indicating that the module control circuit 24A has an abnormality (step S109), whereas, if the result is normal, it generates an abnormality alarm indicating that the external module 20A has an abnormality (step S110) and terminates the processing.

As explained above, even if a failure occurs in either power supply circuit 16A or 16B, the other power supply circuit can be used to supply power to the internal logic 12, which allows the internal logic 12 to continue to operate. Also, when a failure occurs in either power supply circuit 16A or 16B, the module control circuit (24A or 24B) in the faulty power supply circuit performs a self-test, and if an abnormality is detected in the test, the power supply control circuit 18 outputs an abnormality alarm indicating that the module control circuit 24A or 24B has a problem. Whereas, if there is no abnormality found in the test, the power supply control circuit 18 judges that the external module 20A or 20B has a problem and outputs an abnormality alarm indicating that fact.

Figure 14:
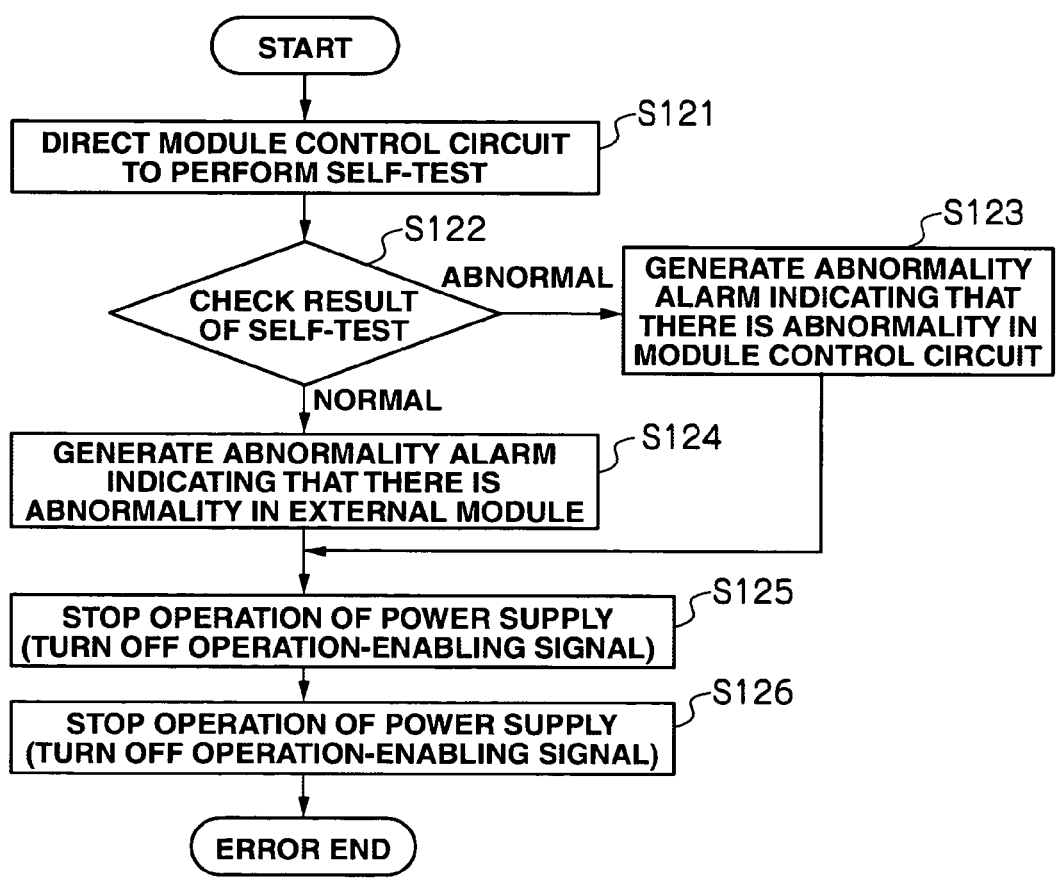
FIG. 14 is a flowchart explaining another method for power supply switching processing.

Another example of the power supply switching processing will be explained with reference to FIG. 14. Although the processing is performed without stopping the operation of the internal logic 12 in the flowchart in FIG. 13, this example adopts a different method where the operations of the internal logic 12 and power supply circuits supplying power to the internal logic 12 are stopped and restarted in accordance with a restart flow.

More specifically, when a failure occurs in the external module 20A in the power supply circuit 16A, the power supply control circuit 18 directs the module control circuit 24A to perform a self-test (step S121). The module control circuit 24A then performs a self-test. The power supply control circuit 18 checks the test result and judges whether the result is normal or abnormal (step S122) and, if the result is abnormal, it generates an abnormality alarm indicating that the module control circuit 24A has an abnormality and proceeds to step S125 (step S123). Whereas, if the result is normal, the power supply control circuit 18 generates an abnormality alarm indicating that the external module 20A has a problem and proceeds to step S125 (step S124). The power supply control circuit 18 then stops outputting the operation-enabling signals to both module control circuits 26A and 26B to stop the operation of the power supply circuit 17 (step S125) and also stops outputting the operation-enabling signals to the module control circuits 24A and 24B to stop the operation of the power supply circuit 16 (step S126), and terminates the processing.

With the method where the operations of the internal logic 12 and power supply circuit 16 supplying power to the internal logic 12 are stopped and restarted according to the start-up flow, it is possible to restart the internal logic 12 if the internal logic 12 malfunctions due to a power failure.

Periodic Test Processing

Figure 15:
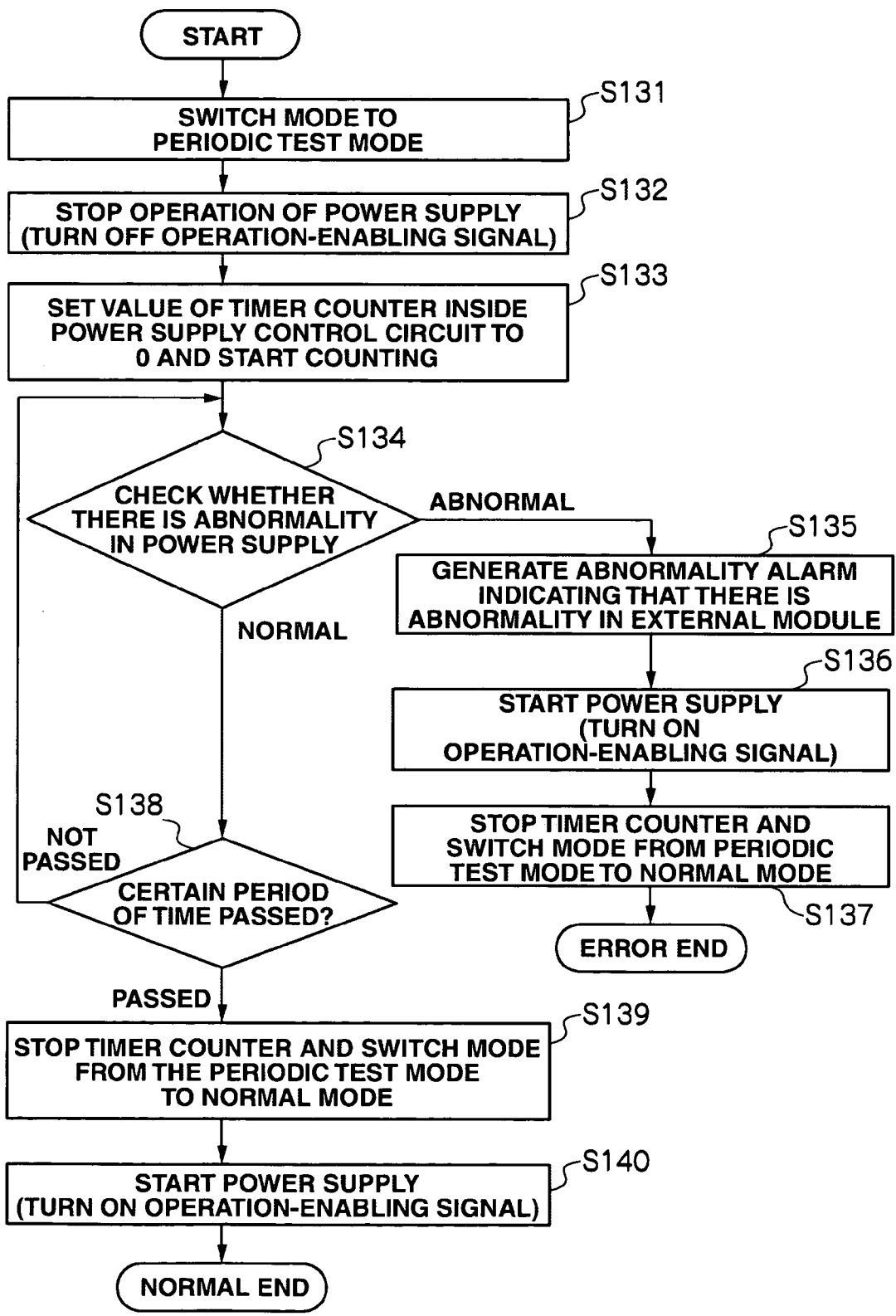
FIG. 15 is a flowchart explaining periodic test processing.
Figure 16:
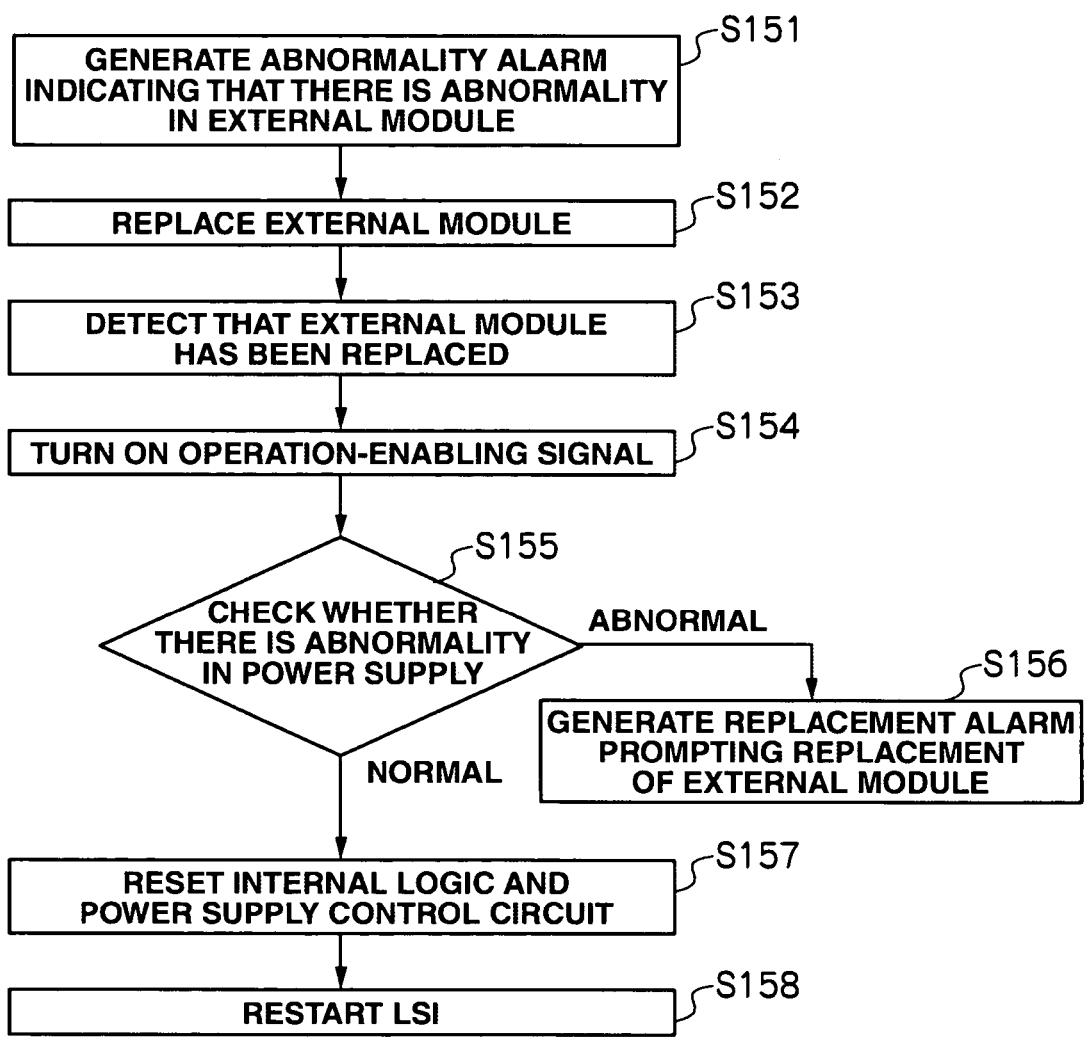
FIG. 16 is a flowchart explaining replacement processing for external modules.

When a failure occurs in either power supply circuit 16A or 16B, it is necessary to supply power to the internal logic 12 from the other normally-operating power supply circuit. In the case of the duplex power supply circuit 16 consisting of power supply circuits 16A and 16B, the power supply circuits 16A and 16B each provide 50% of the power required by the internal logic 12; however, once a failure occurs in one of them, the other has to provide 100% of the power. Here, if the other power supply circuit (16A or 16B) also partially has a problem and can provide 50% but not 100% of the power, it is no longer possible to operate the internal logic 12 and so the internal logic 12 stops operating. So, for switching the power supply circuits, it is necessary for each power supply circuit to perform a test to check whether it can supply 100% of the power required by the internal logic 12 and these checks are performed periodically. The test processing performed periodically for each power supply circuit is explained with reference to FIG. 15.

In order to start a periodic test in each power supply circuit, the microcomputer 52 outputs a periodic test execution signal to the LSI chip 14 at regular intervals. When the signal is input to the LSI chip 14, the power supply control circuit 18 stops the operation of the internal logic 12 and puts it in periodic test mode (step S131) because if a power failure occurs during the test, a malfunction may occur in the internal logic 12. Incidentally, because periodic test mode is a mode for performing tests in the power supply circuits, the power source control circuit 18 increases power consumption in the LSI chip 14. For example, the LSI chip 14 performs loop-back processing to transmit/receive dummy data within itself.

Before switching from the power supply circuit 16A to the power supply circuit 16B, once the internal logic 12 enters the periodic test mode, the power supply control circuit 18 stops outputting the operation-enabling signal to the module control signal 24B to stop the operation of the power supply circuit 16B (step S132). After that, in order to perform a self-test while having only the power supply circuit 16A operate for a certain period of time, the power supply control circuit 18 sets the value of a timer counter provided in itself to 0 and starts counting (step S133). The power supply control circuit 18 then judges whether there is an abnormality in the power supply circuit 16A (step 134) and, if the power supply circuit 16A has an abnormality, it generates an abnormality alarm indicating that the external module 20A has an abnormality (step S135), outputs an operation-enabling signal to the module control circuit 24B to start the power supply circuit 16B (step S136), stops the timer counter, and switches the mode of the internal logic 12 from periodic test mode to normal mode (step S137).

Whereas, if it is judged in step S134 that the power supply circuit 16A is normal, the power supply control circuit 18 monitors the value of the timer counter, judges whether the certain period of time has passed (step S138), repeats step S134 until the certain period of time has passed, and when the period of time has passed, stops the timer counter, switches the mode of the internal logic 12 from the periodic test mode to the normal mode (step S139), outputs an operation-enabling signal to the module control circuit 24B to start the power supply circuit 16B (step S140), and terminates the processing.

External Module Replacement Processing

When a failure occurs in one of the external modules 20A and 20B in the power supply circuits 16A and 16B, the faulty external module is removed from the LSI chip 14 and replaced with a normal external module to recover from the failure.

More specifically, upon a power failure, i.e., when a failure occurs in either external module 20A or 20B, the power supply control circuit 18 generates an abnormality alarm indicating that fact (step S151). After that, when the faulty external module is replaced (step S152), the power supply control circuit 18 detects that the replacement has been performed (step S153). For example, in the case where the external modules 20A and 20B are connected to the module control circuits 24A and 24B, if that the configuration is one where the external modules 20A and 20B output 'High' as specific signals, when one of the external modules 20A and 20B is removed, one of the specific signals 'High' is no longer output After that, when an external module is mounted, the external module outputs the specific signal 'High.' Accordingly, by checking whether the specific signal 'High' is output or not, the power supply control circuit 18 can know if the faulty external module has been replaced.

When the power supply control circuit 18 detects the replacement of the faulty external module, it outputs operation-enabling signals to the module control circuits 24A and 24B (step S154). More specifically, when a failure occurs in either external module 20A or 20B in the power supply circuit 16A or 16B, the power supply control circuit 18 stops outputting the operation-enabling signal to the relevant module control circuit (24A or 24B). Accordingly, after the faulty external module 20A or 20B is replaced, the power supply control circuit 18 again outputs the operation-enabling signal to start the relevant power supply circuit 16A or 16B. After that, in order to check the states of the power supply circuits 16A and 16B, the power supply control circuit 18 judges whether the external modules 20A and 20B are in normal or abnormal states (step S155), and when either of them has an abnormality, the power supply control circuit 18 generates a replacement alarm prompting replacement of the faulty external module (step S156). Here, if a power failure still occurs with the new external module, the new external module itself may have a problem.

Whereas, if the power supply control circuit 18 judges in step S155 that both external modules 20A and 20B are normal, it resets the internal logic 12 (step S157), restarts the internal logic 12 (step S158) and terminates the processing.

Figure 6:
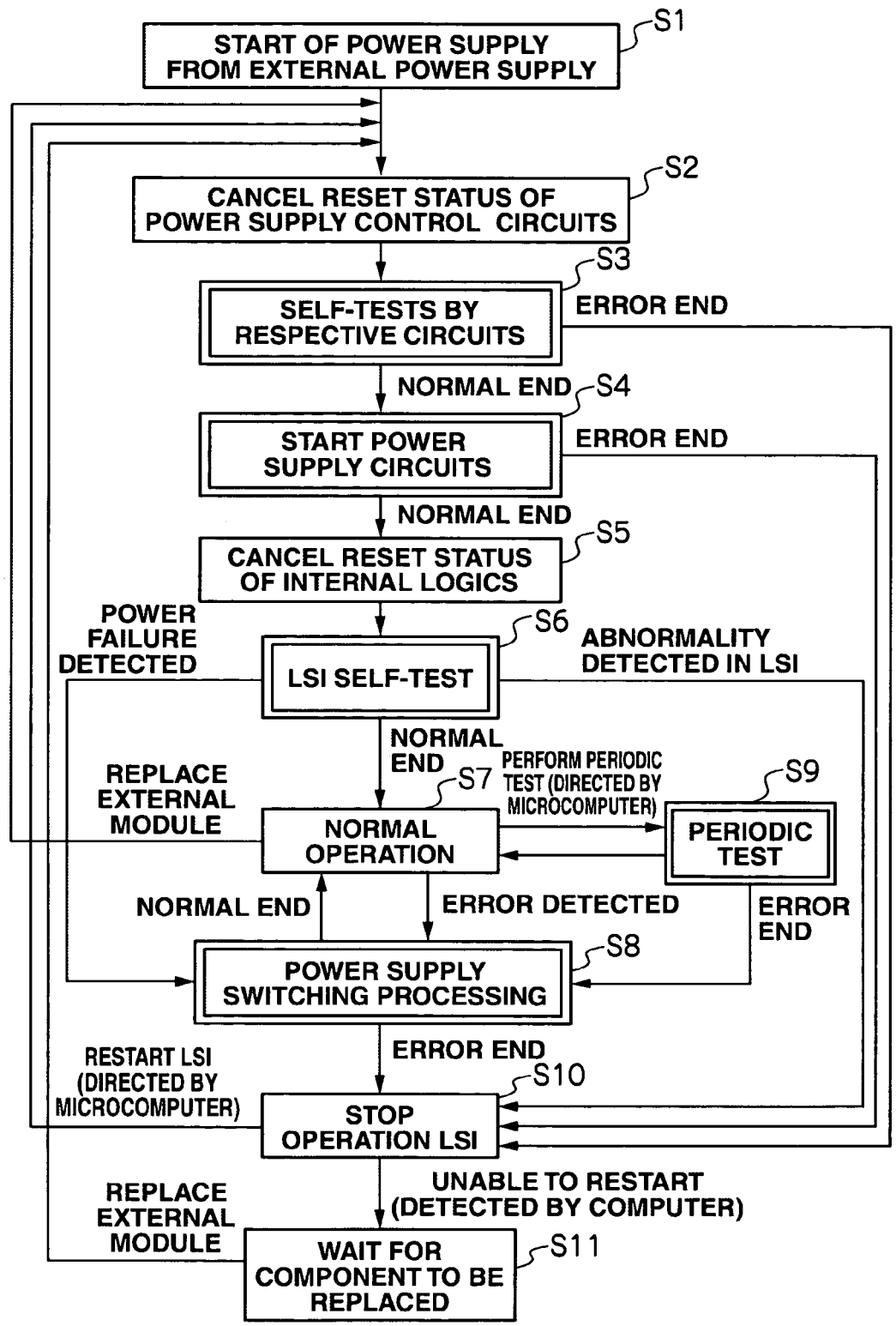
FIG. 6 is a flowchart explaining all of the operations performed in Example 2 of this invention.

Once the faulty external module is replaced, the power supply control circuit 18 proceeds from step S7 'normal operation' in FIG. 6 or step S11 'waiting for replacement' to step S2 'cancel reset states of power supply control circuits' and, in order to restart the internal logic 12, the power supply control circuit 18 notifies the microcomputer 52 monitoring the operational status of the internal logic 12 of the restart of the internal logic 12.

High-Reliability Configuration of LSI

Figure 17:
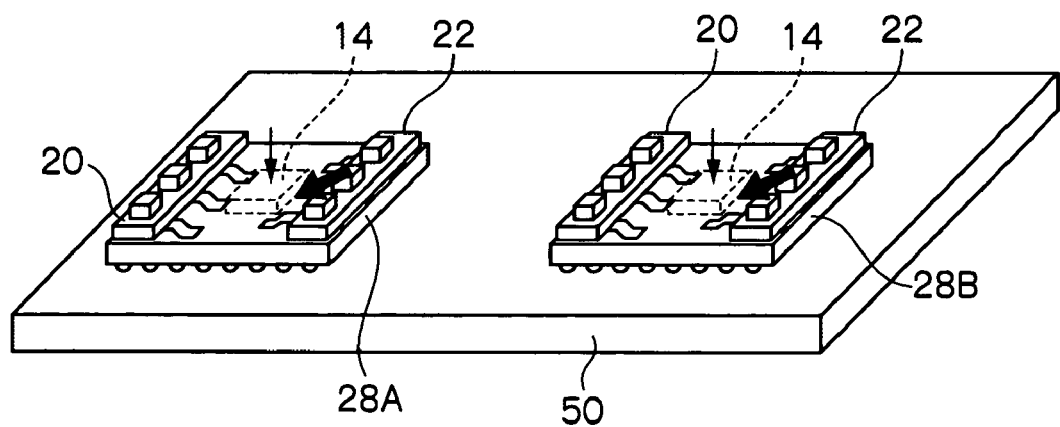
FIG. 17 is a perspective view of a semiconductor integrated circuit device, showing an example where a substrate has an LSI with a built-in duplex power supply mounted thereon.
Figure 18:
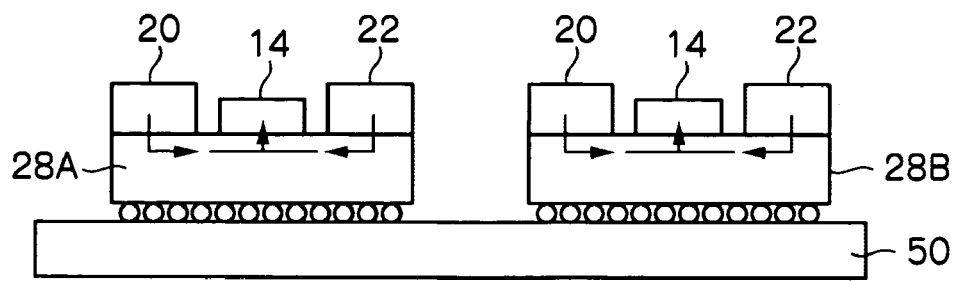
FIG. 18 is a front view explaining power supply paths in the LSI with a built-in duplex power supply.
Figure 19:
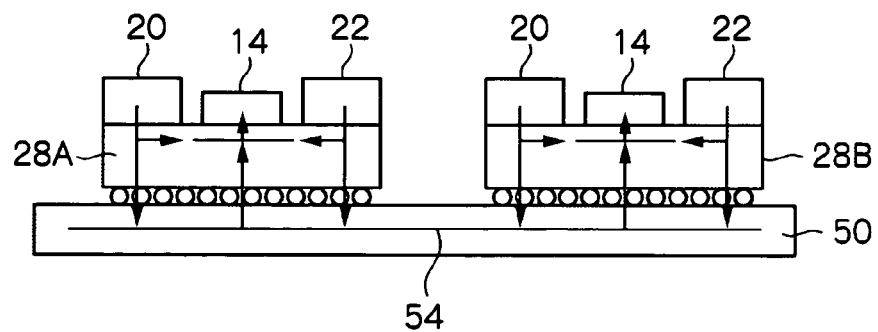
FIG. 19 is a front view explaining power supply paths between the substrate and the LSI with a built-in duplex power supply.

FIG. 17 shows an example of an LSI with a built-in duplex power supply, where two LSI packages (LSIA 28A and LSIB 28B) are mounted on a substrate 50. Each LSI package has mounted thereon: an LSI chip 14 having an internal logic 12, power supply control circuit 18, module control circuits 24 and 26; and external modules 20 and 22. The respective components on the LSI package 28A are supplied with power from the external modules 20 and 22 mounted on the same via internal lines Likewise, the respective components in the in the LSI package 28B are also supplied with power from the external modules 20 and 22 mounted on the same via internal lines. More specifically, regarding the power supply paths, as shown in FIG. 18, the LSI chip 14 on the LSI package 28A is supplied with power from the external modules 20 and 22 via the LSI package 28A; and the LSI chip 14 on the LSI package 28B is supplied with power from the external modules 20 and 22 via the LSI package 28B. In this case, when a failure occurs in both the external modules 20 and 22 on the LSI package 28A, power is no longer supplied to the LSI chip 14 on the LSI package 28A, and consequently, the chip 14 stops operating. LSIs like the one described above cannot provide high reliability.

Thereupon, it the configuration is one where, upon a power failure in either LSI package 28A or 28B mounted on the substrate 50, power is supplied from the power supply in the normal LSI package to the LSI chip 14 in the LSI package with the faulty power supply via the substrate line (external line) 54 in the substrate 54.

Here, it is assumed that the power consumption in the LSI package 28A and LSI package 28B are the same. When all the power supply circuits are normal, each of the four external modules (20 and 22) provides 50% of its power to run the LSI chips 40. When a failure occurs in one of the four external modules, each of the three remaining external modules provides 66.6% of its power to run the LSI chips 40. When a failure occurs in two external modules, each of the two remaining external modules provides 100% of its power to run the LSI chips 40. However, when a failure occurs in three external modules, the one remaining external module has to provide 200% of its power to run the LSI chips 40, which is naturally impossible, as it exceeds 100%. Accordingly, when a failure occurs in two external modules from among the four external modules 20 and 22, it is necessary to replace the faulty external modules immediately.

In this example, because the identically-configured two LSI packages 28A and 28B are mounted on the same substrate 50 and because the LSI chips 14 and external modules 20 and 22 mounted on the LSI packages 28A and 28B are connected to one another via the substrate line 54 in the substrate 50, even when a failure occurs in the power supply of either LSI package 28A or 28B, it is possible to supply power from the power supply for the normal LSI package to the LSI chip 14 on the LSI package with the faulty power supply via the substrate line 54, thereby, improving the reliability of the respective LSI chips 14. This is also effective in terms of substrate mounting and costs.

Figure 20:
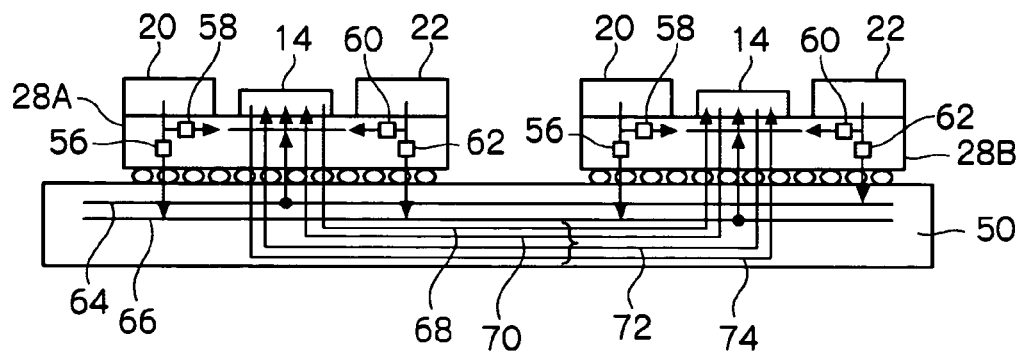
FIG. 20 is a perspective view of the semiconductor integrated circuit device, showing another example where a substrate has an LSI with a built-in duplex power supply mounted thereon.
Figure 21:
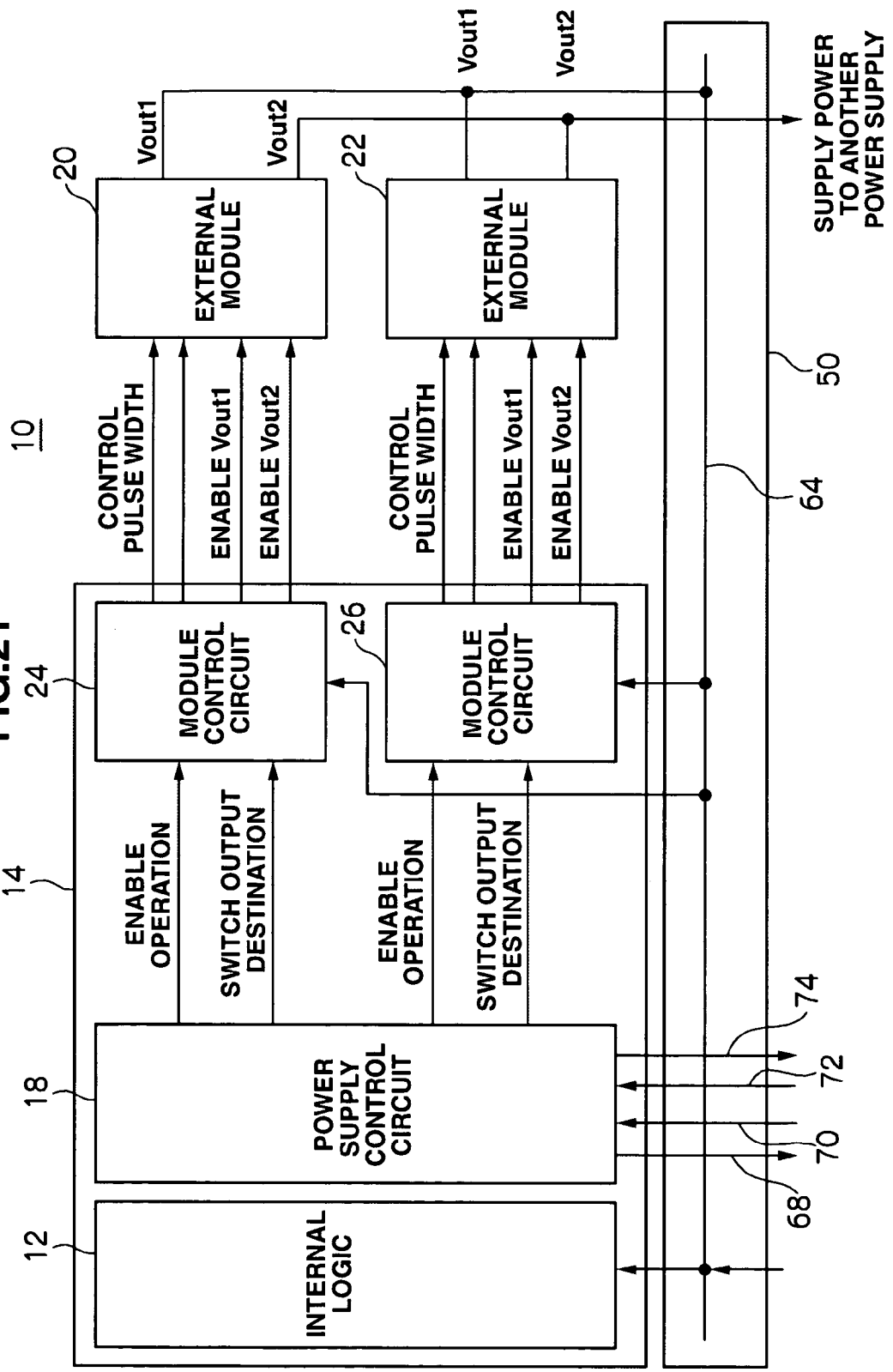
FIG. 21 is a block diagram of the semiconductor integrated circuit device, showing another example where a substrate has an LSI with a built-in duplex power supply mounted thereon.
Figure 22:
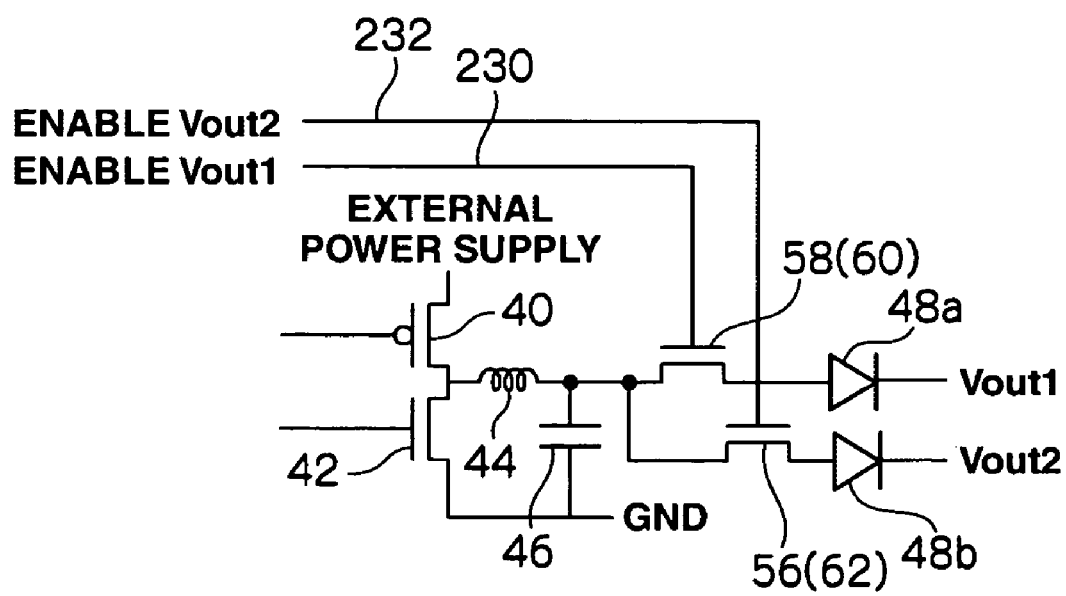
FIG. 22 is a circuit diagram of an external module.

FIGS. 20 to 22 show another example of an LSI with a built-in duplex power supply where two LSI packages (LSI A 28A and LSI B 28B) are mounted on the substrate 50. In this example, each LSI package is provided With switching elements 56, 58, 60 and 62 serving as power supply switching units, and the substrate 50 is provided with power-supplying substrate lines (64, 66) and signal-transmitting substrate lines 68, 70, 72 and 74 so that the power supply paths are controlled by switching on/off the switching elements 56, 58, 60 and 62. Other configurations in this example are same as that in the previous example.

When supplying power to the LSI chips 14 on the LSI packages 28A and 28B, the switching elements 56 and 62 are turned off and the switching elements 58 and 60 are turned on so that the external modules 20 and 22 mounted on the LSI packages 28A and 28B supply power to the LSI chips 14 on the same.

Whereas, when a failure occurs in any of the power supplies mounted on the LSI packages 28A and 28B, the switching elements 56 and 62 are turned on and the switching elements 58 and 60 are turned off so that power is supplied from the normal power supply to the LSI chip 14 mounted on the LSI package with the faulty power supply via the substrate line 64 or 66. For example, when a failure occurs in the power supply for the LSI package 28A, the power supply control circuit 18 on the LSI package 28A first outputs a power supply request signal to the other power supply control circuit 18 on the LSI package 28B via the substrate line 68. If, in response to the signal, the power supply control circuit 18 on the LSI package 28B outputs a power supply permission signal to the power supply control circuit 18 on the LSI package 28A via the substrate line 70, the external modules 20 and 22 on the LSI package 28B supply power to the LSI chip 14 on the LSI package 28A via the substrate line 64. On the other hand, if a failure occurs in the power supply for the LSI package 28B, the power supply control circuit 18 on the LSI package 28B outputs a power supply request signal to the power supply control circuit 18 on the LSI package 28A via the substrate line 72. If, in response to the signal, the power supply control circuit 18 on the LSI package 28A outputs a power supply permission signal to the power supply control circuit 18 on the LSI package 28B via the substrate line 74, the external modules 20 and 22 on the LSI package 28A supply power to the LSI chip 14 on the LSI package 28B via the substrate line 66. Incidentally, the power supply control circuits are able to operate during power failures because they are driven only by the external power supplies.

In order to control the power supply paths using the switching elements 56, 58, 60 and 62, as shown in FIG. 22, diodes 48a and 48b are provided in the external modules 20 and 22; the switching elements 58 and 60 are inserted between the diodes 48a and condensers 46; and the power supply control circuit 18 outputs an output destination switching signal to the module control circuits 24 and 26 in order to select either Vout1 or Vout2 as an output from the external modules 20 and 22. When the power supply control circuit 18 outputs an output destination switching signal for selecting Vout1, the module control circuits 24 and 26 output a Vout1-enabling 'ON' signal 230 to the switching elements 58 and 60 to turn on the switching elements 58 and 60; and output a Vout2-enabling 'OFF' signal 232 to the switching elements 56 and 62 to turn off the switching elements 56 and 62, consequently, the external modules 20 and 22 output Vout1 (i.e., supply power) to the LSI chips 14 on the LSI packages 28A and 28B via the diodes 48a. When a failure occurs in one of the power supplies on the LSI packages 28A and 28B, the power supply control circuit 18 with the normally-operating power supply outputs an output destination switching signal to the module control circuits 24 and 26 in order to select Vout2; the module control circuits 24 and 26 output a Vout1-enabling 'OFF' signal 230 to the switching elements 58 and 60 to turn off the switching elements 58 and 60; output a Vout2-enabling 'ON' signal 232 to the switching elements 56 and 60 to turn on the switching elements 56 and 62, consequently, the external modules 20 and 22 outputs Vout2 (i.e., supply power) to the LSI chip 14 on the faulty LSI package via the diodes 48b. Incidentally, MOS transistors may be used for the switching elements 56, 58, 60 and 62; however, there is no particular limitation.

Figure 23:
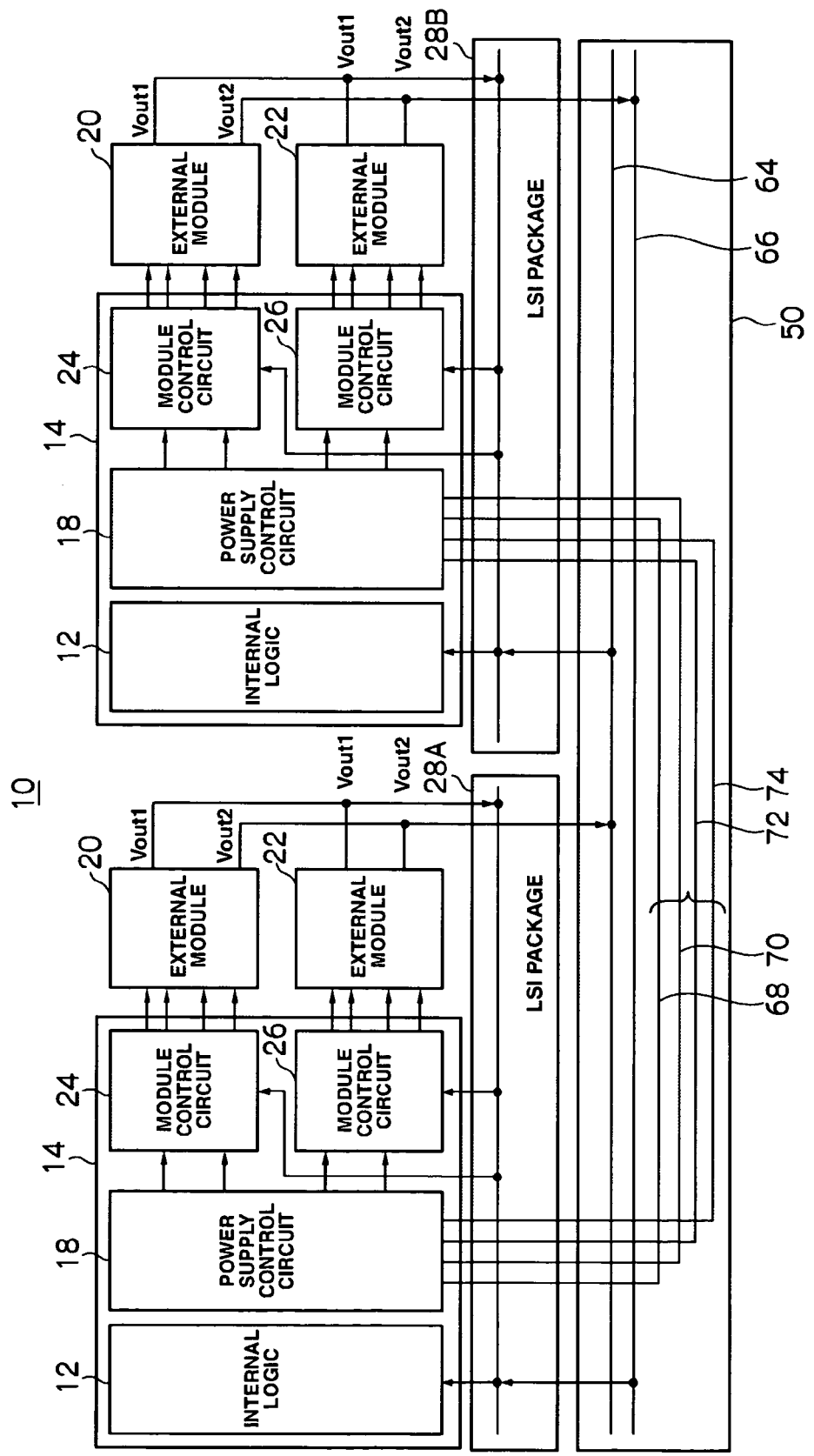
FIG. 23 is a block diagram of a semiconductor integrated circuit device, showing an example where two LSI packages are mounted on a single substrate.

An example where LSI packages 28A and 28B, each having an LSI chip 14 and external modules 20 and 22 being able to control power supply paths, is shown in FIG. 23.

Figure 24:
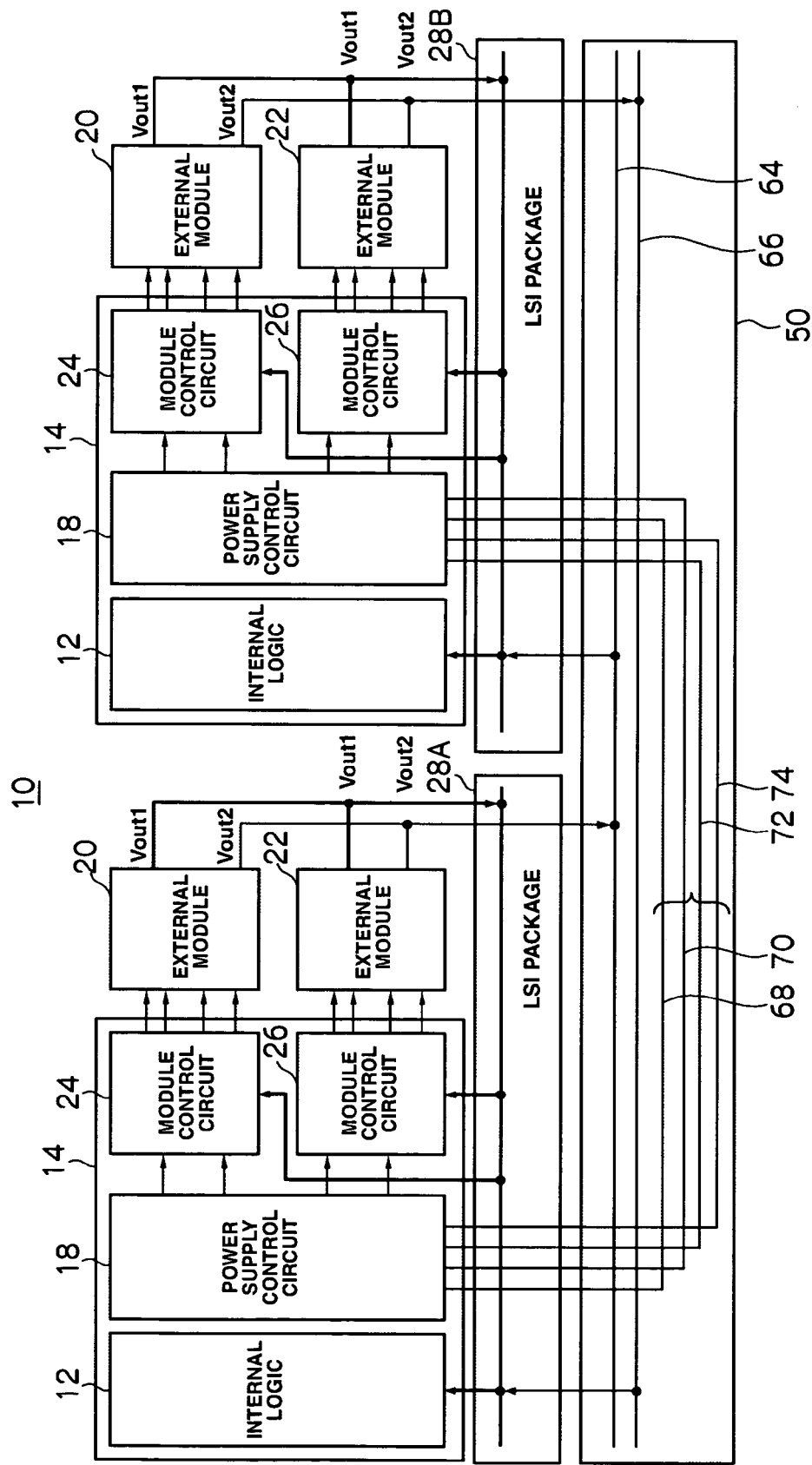
FIG. 24 is a diagram explaining power supply paths under normal power supply conditions in the example where two LSI packages are mounted on a single substrate.

In this example, when there is no abnormality in the LSI packages 28A and 28B, as shown in FIG. 24, the external modules 20 and 22 on the LSI package 28A output Vout1 (i.e., supply power) to the internal logic 12 and module control circuits 24 and 26 on the LSI chip 14 on the LSI package 28A via a line inside the LSI package 28A while the external modules 20 and 22 on the LSI package 28B output Vout2 (i.e., supply power) to the internal logic 12 and module control circuits 24 and 26 on the LSI chip 14 on the LSI package 28B via a line inside the LSI package 28B.

Figure 25:
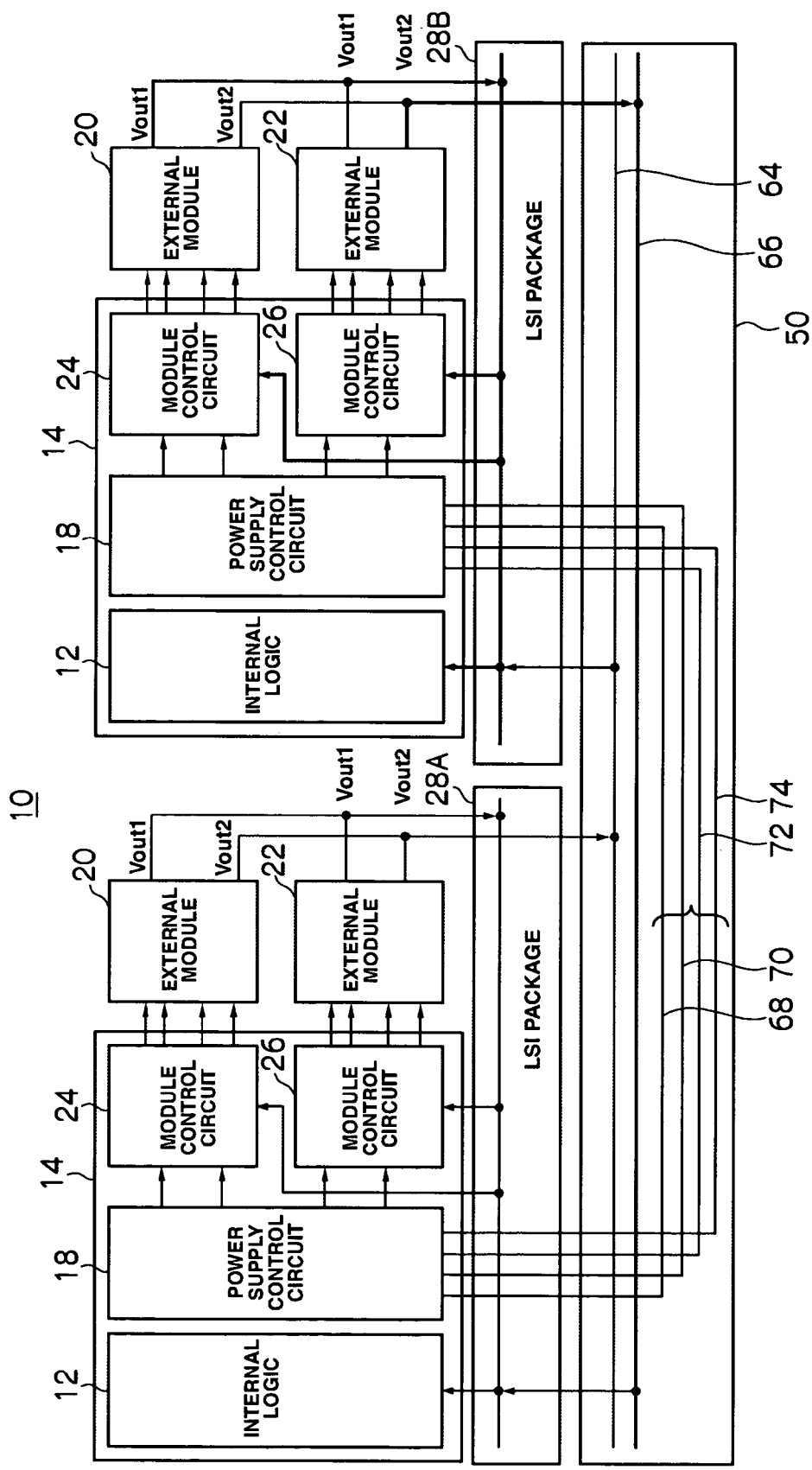
FIG. 25 is a diagram explaining the power supply paths, upon a power failure in the example where two LSI packages are mounted on a single substrate.

When a power failure occurs in the LSI package 28A, as shown in FIG. 25, the external modules 20 and 22 on the LSI package 28A output Vout1 (i.e., supply power) to the internal logic 12 and module control circuits 24 and 26 on the LSI chip 14 on the LSI package 28A, and once the power supply request signal passing through the substrate line 68 is turned 'ON,' the power supply permission signal passing through the substrate line 70 is turned 'ON,' the power supply request signal passing through the substrate line 72 is turned 'OFF,' and the power supply permission signal passing through the substrate line 74 is turned 'OFF,' the external modules 20 and 22 on the LSI package 28B output Vout1 to the internal logic 12 on the LSI chip 14 on the LSI package 28A via the substrate line 66 inside the substrate 50.

The processing performed in the LSI packages 28A and 28B respectively upon a power failure in the LSI package 28A is explained in detail below.

Figure 26:
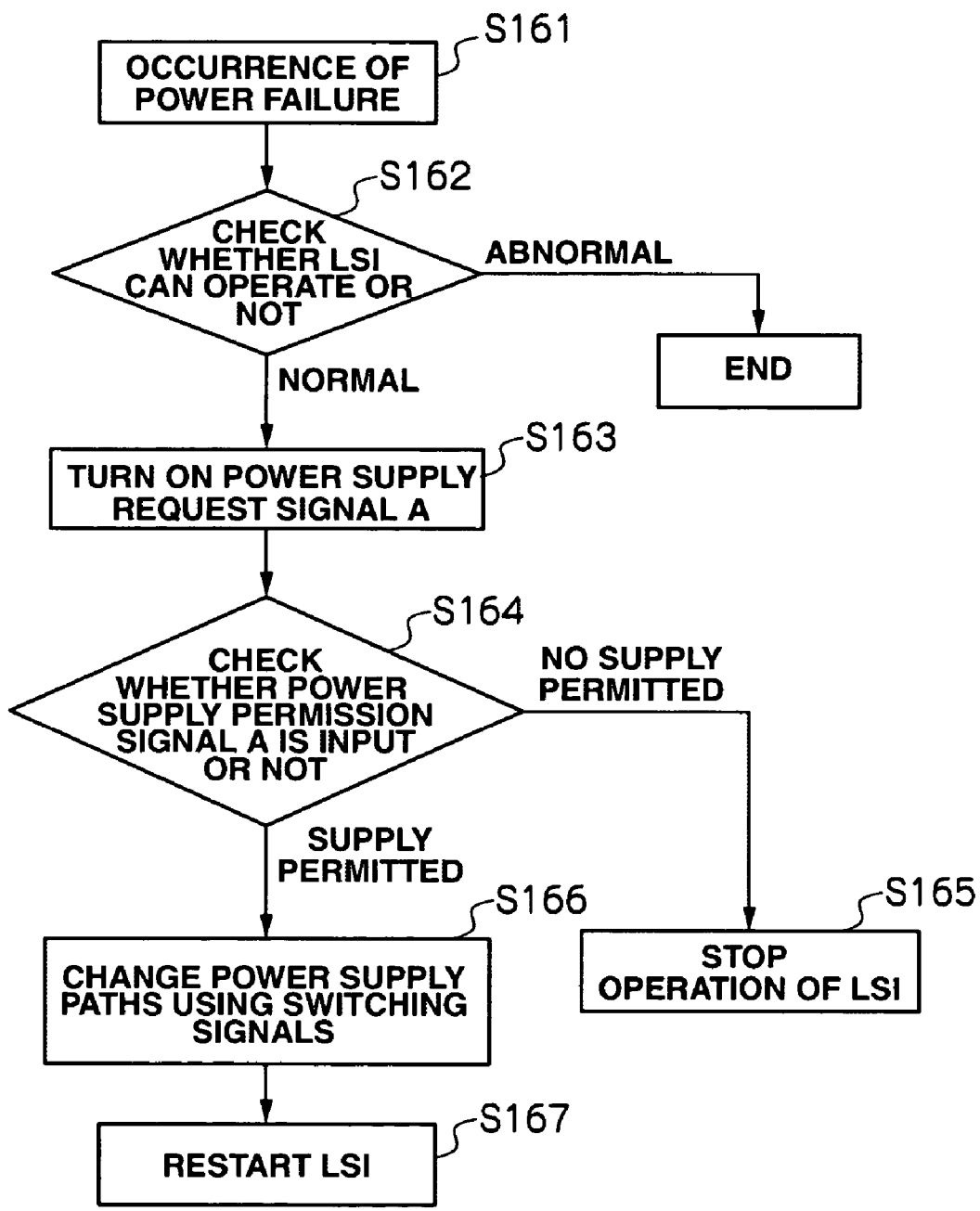
FIG. 26 is a flowchart explaining power supply switching processing in the example where two LSI packages are mounted on a single substrate.

First, the processing performed in the LSI package 28A upon a power failure in itself is explained. As shown in FIG. 26, when a failure occurs in the power supply on the LSI package 28A (i.e., a power failure) (step S161), the power supply control circuit 18 judges whether the internal logic 12 is in a normal or abnormal state in order to check whether the internal logic 12 can operate or not (step S162) and, if it is in an abnormal state, the power supply control circuit 18 terminates the processing. Whereas, if the internal logic 12 is in a normal state, the power supply control circuit 18 turns on a power supply request signal (step S163). Here, the power supply control circuit 18 judges that the internal logic 12 is in a normal state if the results of self-tests by the power supply control circuit 18 itself and the internal logic 12 are normal, and in other cases, it judges that the internal logic 12 is in an abnormal state. If a failure occurs in the module control circuit 24 or 26 or external module 20 or 22, the failure can be recovered from by switching the power supply paths; however, if a failure occurs in the internal logic 12 or power supply control circuit 18, the failure cannot be recovered from by switching the paths.

The power supply control circuit 18 then checks whether a power supply permission signal is input from the other power supply control circuit 18 on the LSI package 28B (step S164). If the power supply is not permitted, the power supply control circuit 18 on the LSI package 28A stops the operation of the internal logic 12 (step S165). Whereas, if the power supply is permitted, it changes the power supply paths using switching signals (step S166) and restarts the internal logic 12 (step S167).

Figure 27:
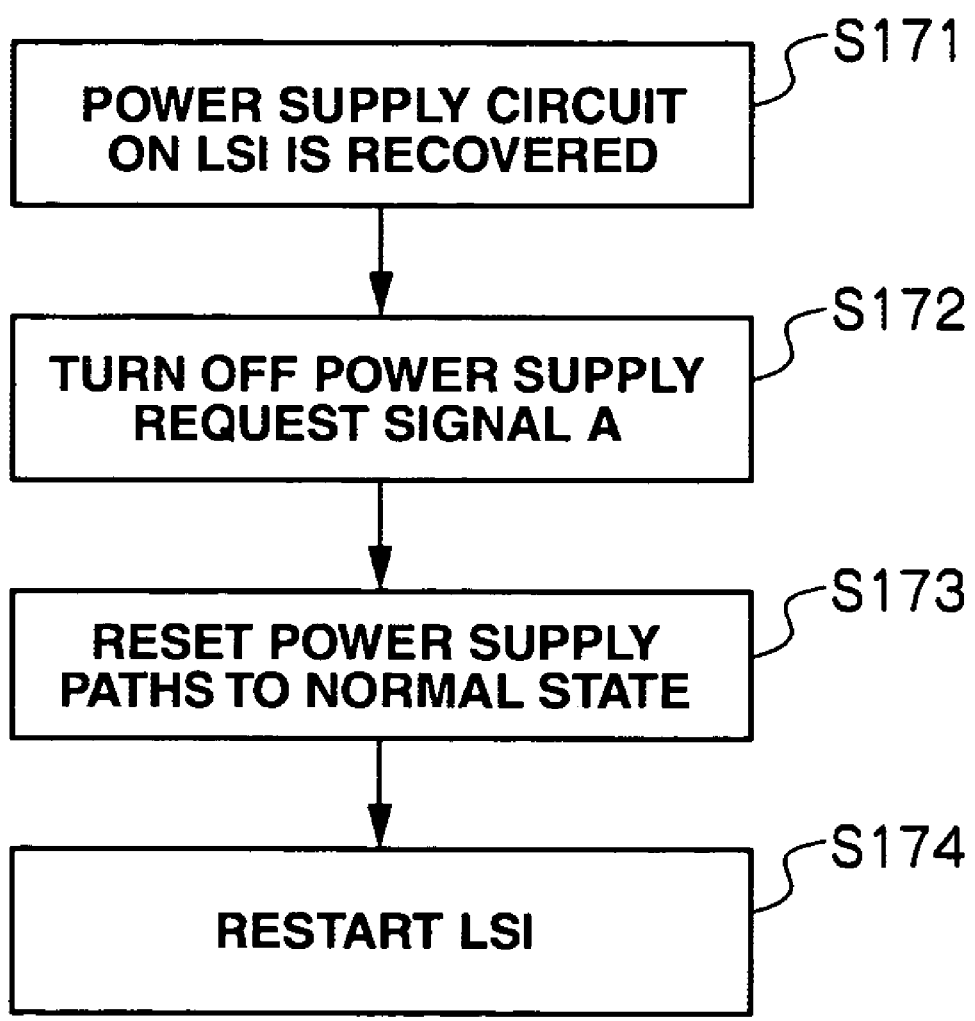
FIG. 27 is a flowchart explaining the power supply recovery processing in the example where two LSI packages are mounted on a single substrate.
Figure 28:
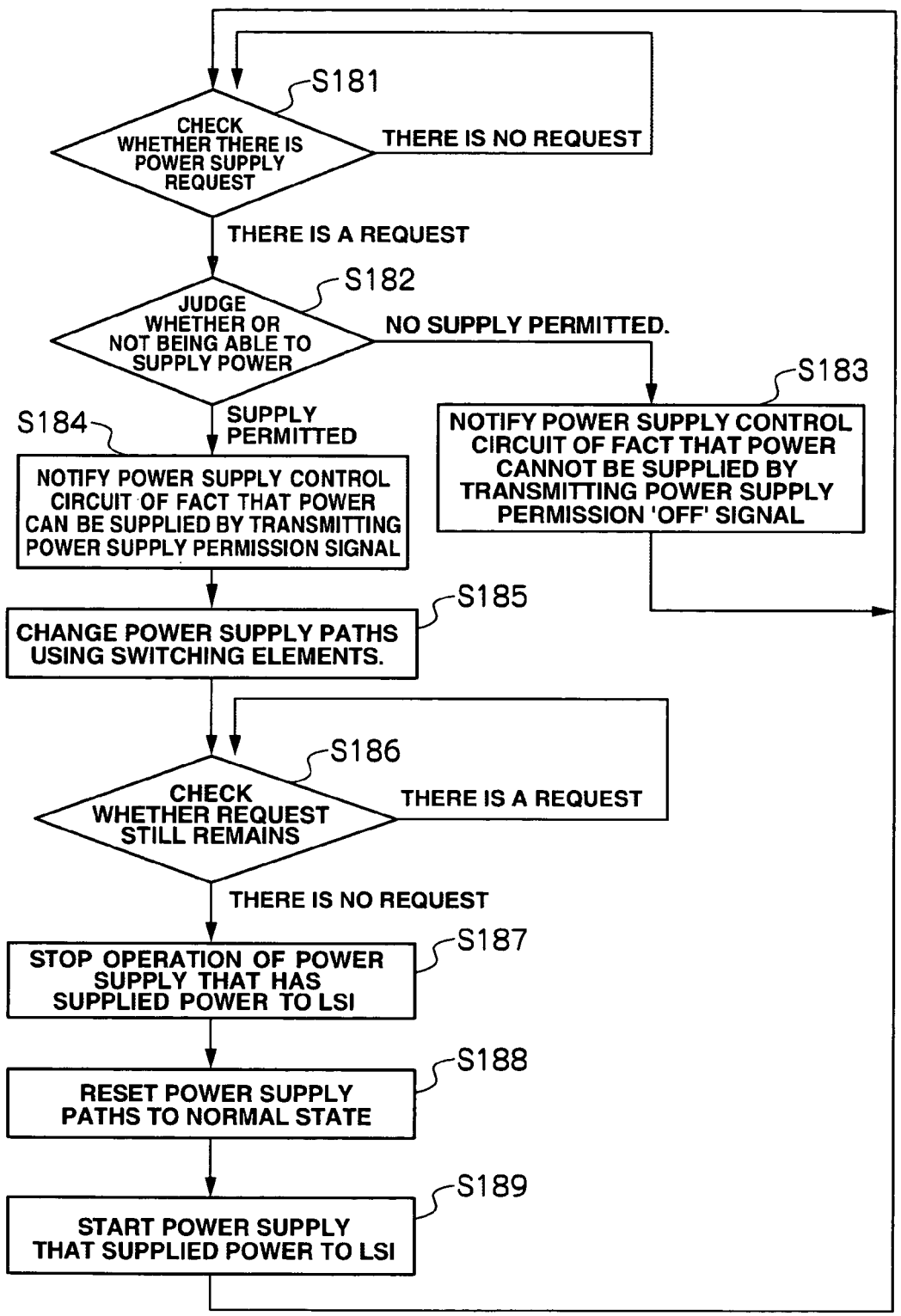
FIG. 28 is a flowchart explaining other power supply switching processing in the example where two LSI packages are mounted on a single substrate.

When the power supply circuit 16 on the LSI package 28A is recovered by replacing the faulty external module 20 or 22, as shown in FIG. 27, the power supply control circuit 18 resets the power supply paths and then restarts the internal logic 12. This is because if the newly-replaced external module has a problem, it causes a power failure and, if resetting of the power supply paths is performed while running the internal logic 12, the internal logic 12 may malfunction. The internal logic is restarted after that resetting. More specifically, when the power supply circuit 16 on the LSI package 28A is recovered by replacing the external module 20 or 22 (step S171), the power supply control circuit 18 turns off the power supply request signal (step S172), resets the power supply paths to the normal state (step S173), then restarts the internal logic 12 (step S174).

On the other hand, upon a power failure in the power supply in the LSI package 28A, the power supply control circuit 18 on the LSI package 28B checks whether a power supply request signal has been input from the power supply control circuit 18 on the LSI package 28A (step S181). If the signal has not been input, it repeats step S181 until the signal is input. When the signal is input, the power supply control circuit 18 judges whether it can supply power to the LSI package 28A (step S182) and, if it cannot do so, it notifies the power supply control circuit 18 on the LSI package 28A of that fact by transmitting a power supply permission 'OFF' signal (step S183), and returns to step S181. Whereas, if it can supply power to the LSI package 28A, it notifies the other power supply control circuit 18 in the LSI package 28A of that fact by transmitting a power supply permission signal (step S184), and changes the power supply paths using switching elements (step S185). After that, the power supply control circuit 18 on the LSI package 28B again checks whether the power supply request signal from the power supply circuit 18 on the LSI package 28A is still ON in order to check whether the request still remains (step S186). If the power supply request is still ON, the power supply control circuit 18 repeats step S186 to continue to supply the power to the LSI package 28A as long as the signal lasts. When the power supply request signal is no longer ON, the power supply control circuit 18 on the LSI package 28B stops the operation of its own power supply that has supplied power to the LSI package 28A (step S187), resets the power supply paths to their normal state (step S188), restarts the same power supply circuit (step S189), and returns to step S181.

In the LSI package 28B, if the power supply paths are reset to their normal state (i.e., from the state where power is supplied to the LSI package 28A to the state where it is supplied to the LSI package 28B) without stopping the operation of the power supply that had supplied power to the LSI package 28A, the power is suddenly supplied to the internal logic 12 on the LSI package 28B, which causes noise that leads to malfunctions in the internal logic 12. Accordingly, when changing the power supply paths in the LSI package 28B, the operation of the power supply on the LSI package 28B is stopped, and restarted after the power supply paths are changed.

Changing of Power Supply Amount Depending on Loads on LSI

In the case where each LSI package (28A, 28B) has an LSI chip 14 and external modules 20 and 22 and the external modules 20 and 22 supply power to the LSI chip 14, when the state inside the LSI chip 14 changes, it may cause a rapid change in its power consumption. For example, when a reset signal is cancelled, the internal logic 12 starts to operate and so its power consumption suddenly increases. Also, when the LSI chip 14 enters normal mode from standby mode, its power consumption rapidly increases. On the other hand, when it enters standby mode from normal mode, its power consumption decreases. If an LSI (LSI chip 14) is mounted in a disk array system, its power consumption changes at the beginning and the end of data transfer. When the power consumption changes rapidly, the power supply circuits cannot keep up with the change and the voltage momentarily increases or decreases. Here, noise may be caused depending on the amount of change in the voltage and that may cause malfunctions in the LSI (LSI chip 14). Therefore, it is necessary to control the noise.

Figure 29:
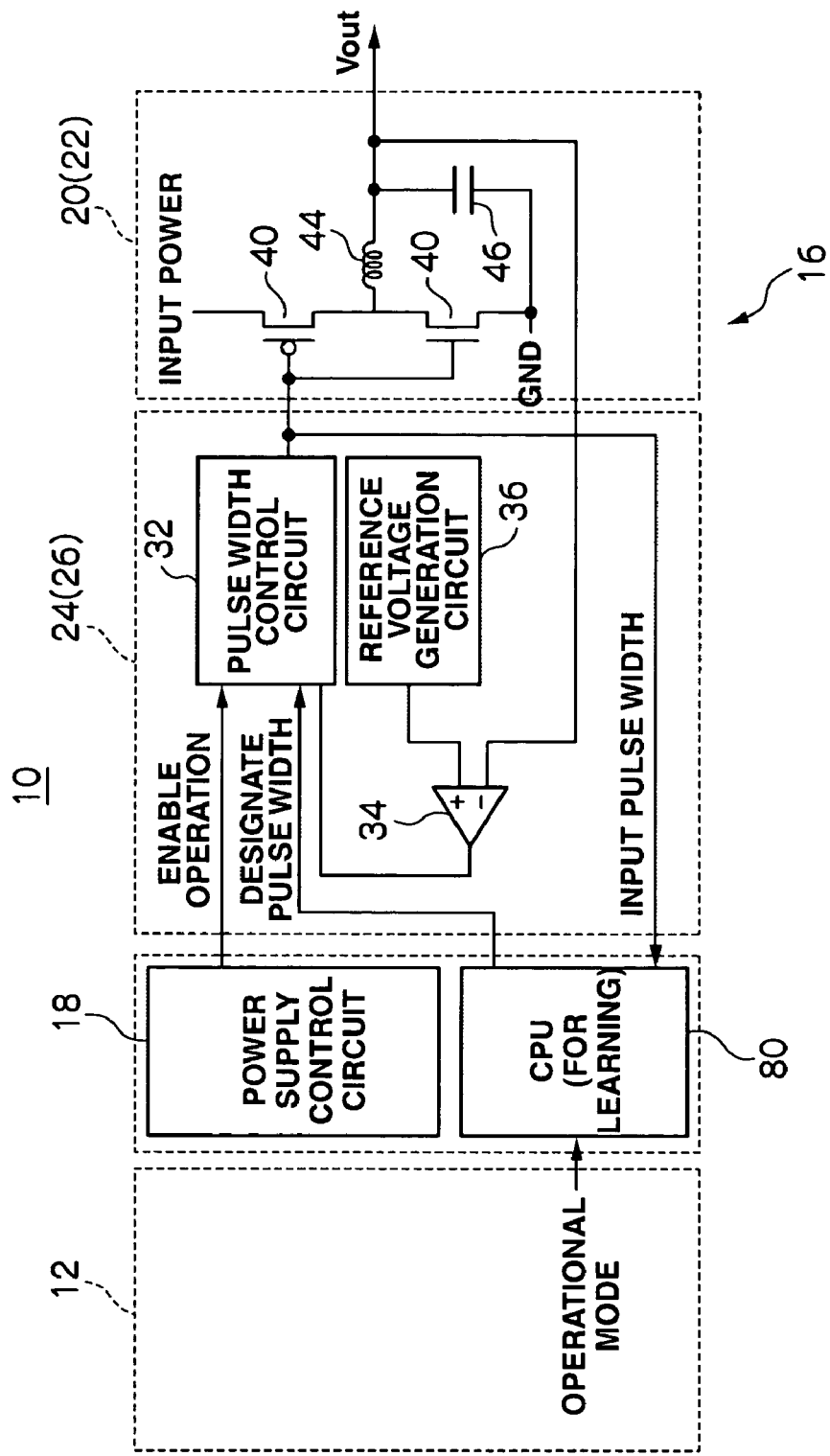
FIG. 29 is a block diagram of a semiconductor integrated circuit device, showing an example where the power supply amount is changed according to the load on an LSI.

One example of the solutions for the foregoing problem is a method where a microcomputer 52 or the like provided inside or outside an LSI (LSI chip 14) learns the relationships between the operation modes of the LSI and the corresponding power supply amounts, so that the microcomputer 52 can adjust the power supply amount before the power consumption rapidly changes. More specifically, as shown in FIG. 29, a CPU (CPU included in the power supply control circuit 18) 80 in the LSI chip 14 learns the pulse widths in the power supply circuit 16 so that, when the operational mode is switched, it can adjust the pulse width to prevent a sudden change in the voltage, thereby preventing the occurrence of noise. For example, four modes—reset mode, standby mode, data transfer-waiting mode and data transfer mode—are set as operational modes and the CPU 80 learns the widths of the pulses output by the module control circuit 24 in the respective modes. Accordingly, when the mode is switched from one to another, the CPU 80 outputs a switching signal with its pulse width adjusted according to the new mode to the external module 20.

Because the CPU 80 provided in the power supply control circuit 18 learns the relationships between the operational modes and the corresponding pulse widths, when the LSI mode is switched from one to another, the CPU 80 outputs a command to change the pulse width to the module control circuit 24. Accordingly, in the new mode, the CPU 80 can output a switching signal with its pulse width adjusted according to the new mode to the external module 20. The CPU 80 is mounted in the power supply control circuit 18 because the power supply control circuit 18 is driven only by the external power supply. The CPU 80 is not suitable for mounting in the internal logic 12 because the internal logic 12 is driven by the voltage output from the external module 20 and if the voltage has noise, it may cause a malfunction in the internal logic 12. Accordingly, with the CPU 80 being mounted on the power supply control circuit 18, which is not affected by the output from the power supply circuit 16, the power supply amount can be adjusted accurately. Incidentally, it is also possible to mount the CPU 80 outside the LSI chip 14 and have it learn the foregoing relationships.

Configuration of LSI with Built-in Power Supply

Figure 30:
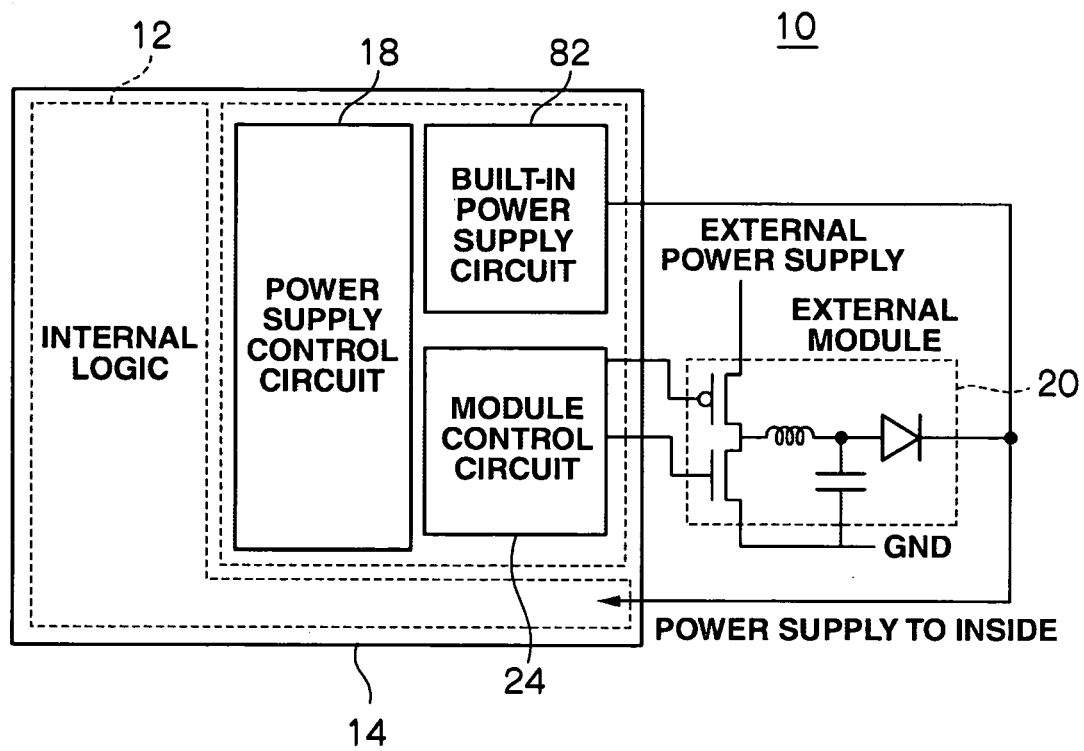
FIG. 30 is a block diagram of a -semiconductor integrated circuit device, showing an example where the semiconductor integrated circuit device has an LSI with a built-in power supply mounted thereon.
Figure 31:
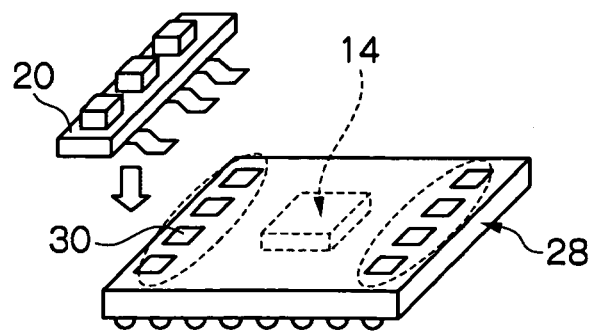
FIG. 31 is an exploded perspective view of the semiconductor integrated circuit device, showing an example where the semiconductor integrated circuit device has an LSI with a built-in power supply mounted thereon.

An example of an LSI chip with a built-in power supply will be explained with reference to FIGS. 30 and 31. In this example, an LSI chip 14 has an internal logic 12, power supply control circuit 18, module control circuit 24 as well as a built-in power supply circuit 82 that serves as a DC-DC converter so that both built-in power circuit 82 and external module 20 supply power to the internal logic 12. The LSI chip 14 including the built-in power supply circuit 82 and the external module 20 are mounted on an LSI package 28.

In a usual conventional LSI with a built-in power supply, when a failure occurs in the built-in power supply, the LSI itself has to be replaced. However, in this example, when a failure occurs in the built-in power supply circuit 82 in the LSI chip 14, the LSI chip 14 does not have to be replaced and the internal logic 12 in the LSI chip 14 is supplied with power using the module control circuit 24 and external module 20.

In this example, because the external module 20, which would occupy a substantial area on the LSI chip 14, is located outside the LSI chip 14, it is possible to minimize the area of the chip and multiplex the power supply in the LSI chip 14. Incidentally, in this example, one module control circuit 24 and one external module 20 are mounted on the LSI package 28; however, alternatively, more than one module control circuit 24 and external module 20 may also be mounted to improve the reliability of the LSI chip 14.

Example of Application in Disk Array System

Figure 32:
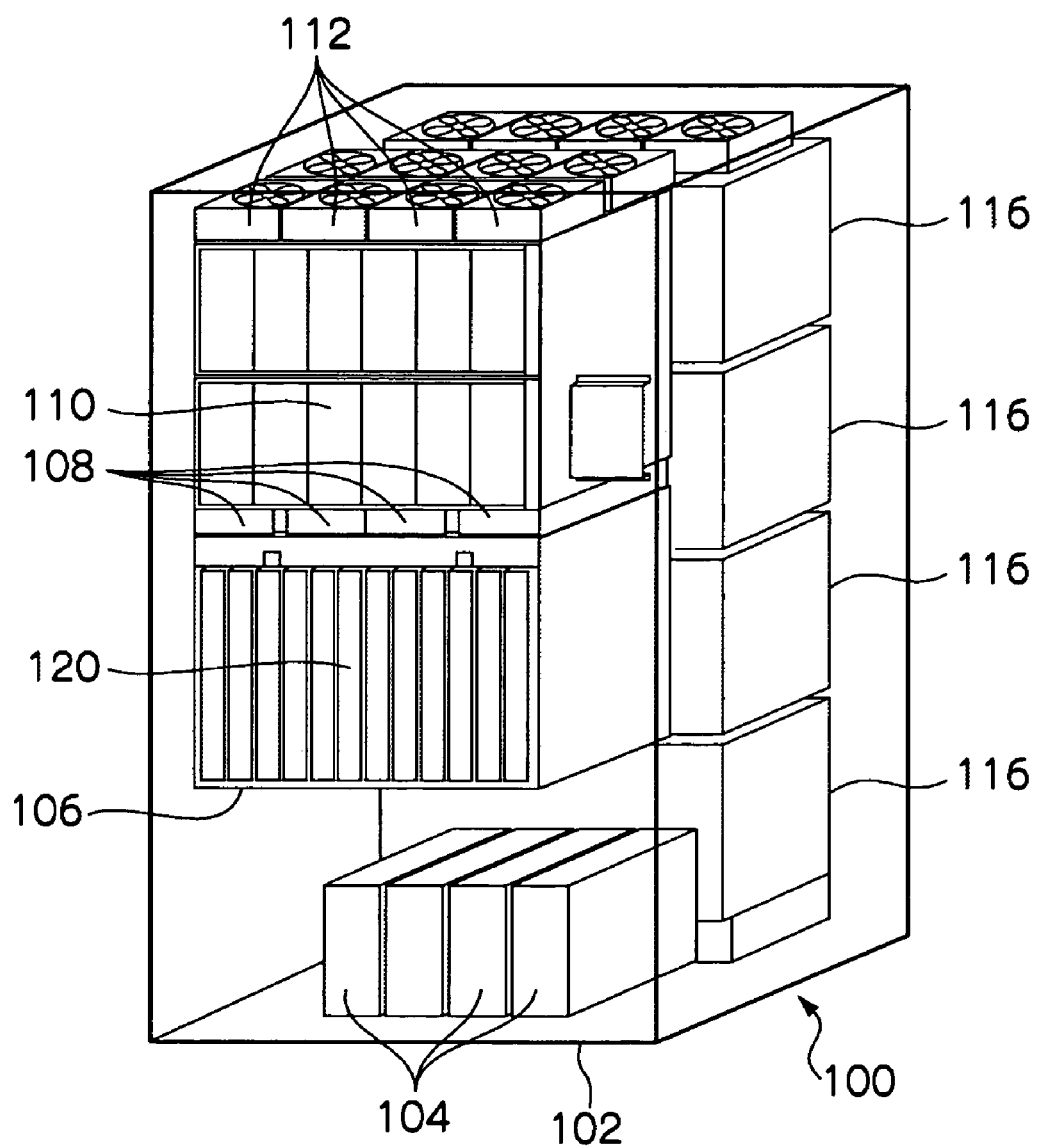
FIG. 32 is a perspective view of a disk array system as seen from the front side, showing an example where the semiconductor integrated circuit device according to this invention is applied to the disk array system.
Figure 33:
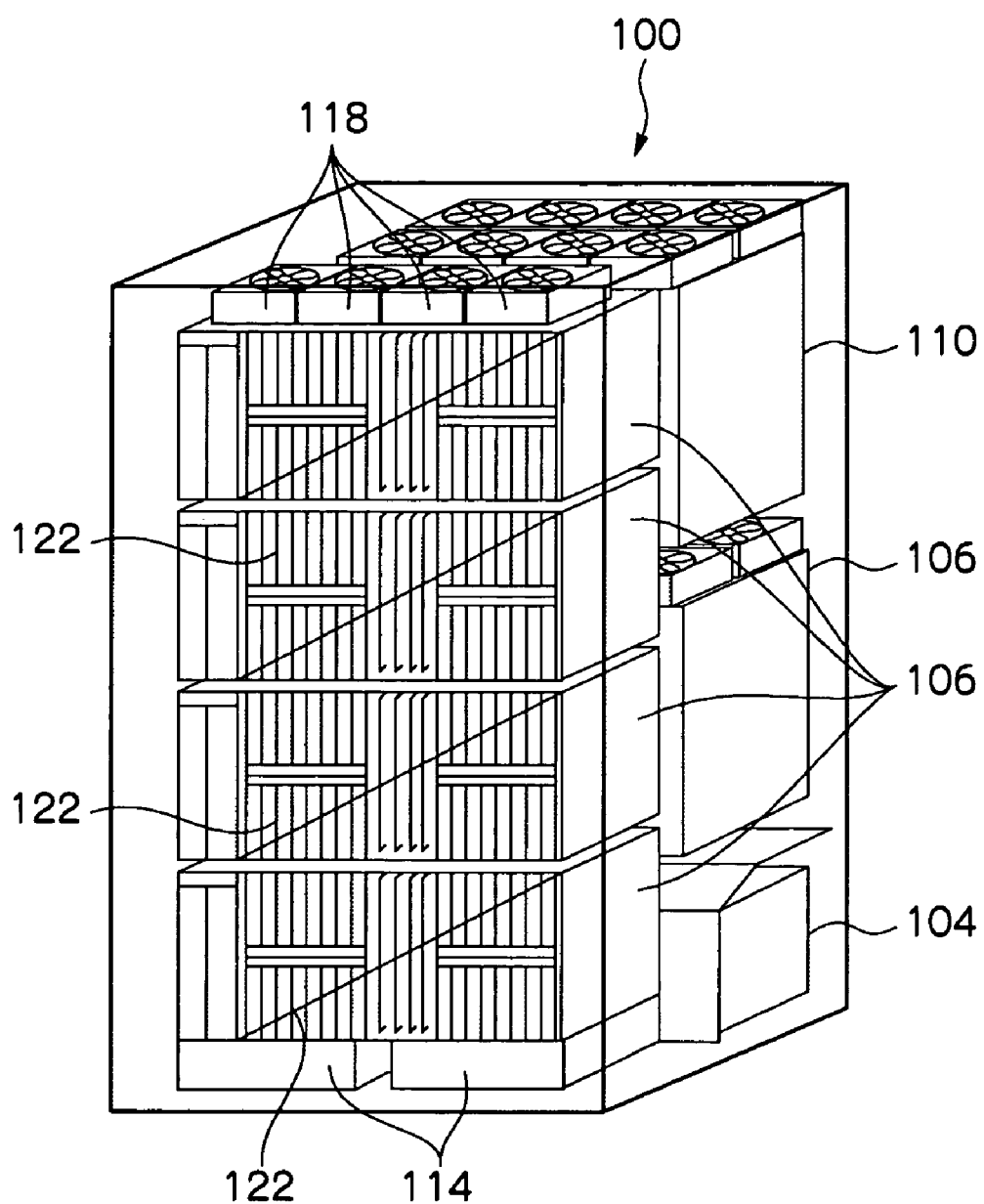
FIG. 33 is a perspective view of the disk array system as seen from the back side, showing an example where the semiconductor integrated circuit device according to this invention is applied to the disk array system

An example where the semiconductor integrated circuit device according to the invention is applied in a disk array system will be explained with reference to FIGS. 32 to 34.

A disk array system 100 has a case 102 housing batteries 104, logical unit 106, fans 108 and 112, and power supply units 110 on the front side; and AC power supplies 114, hard disk drive (HDD) boxes 116 and fans 118 on the back side. The logical unit 106 houses a plurality of boards (substrates) 120 and each HDD box 116 houses a plurality of HDDs 122. The respective boards 120 and HDDs 122 are supplied with power from the power supply units 110 and batteries 104.

The logical unit 106 houses a plurality of boards (substrates) 120 for each kind of function. By housing a plurality of boards (substrates) 120 for each function, the logical unit 106 is multiplexed.

Figure 34:
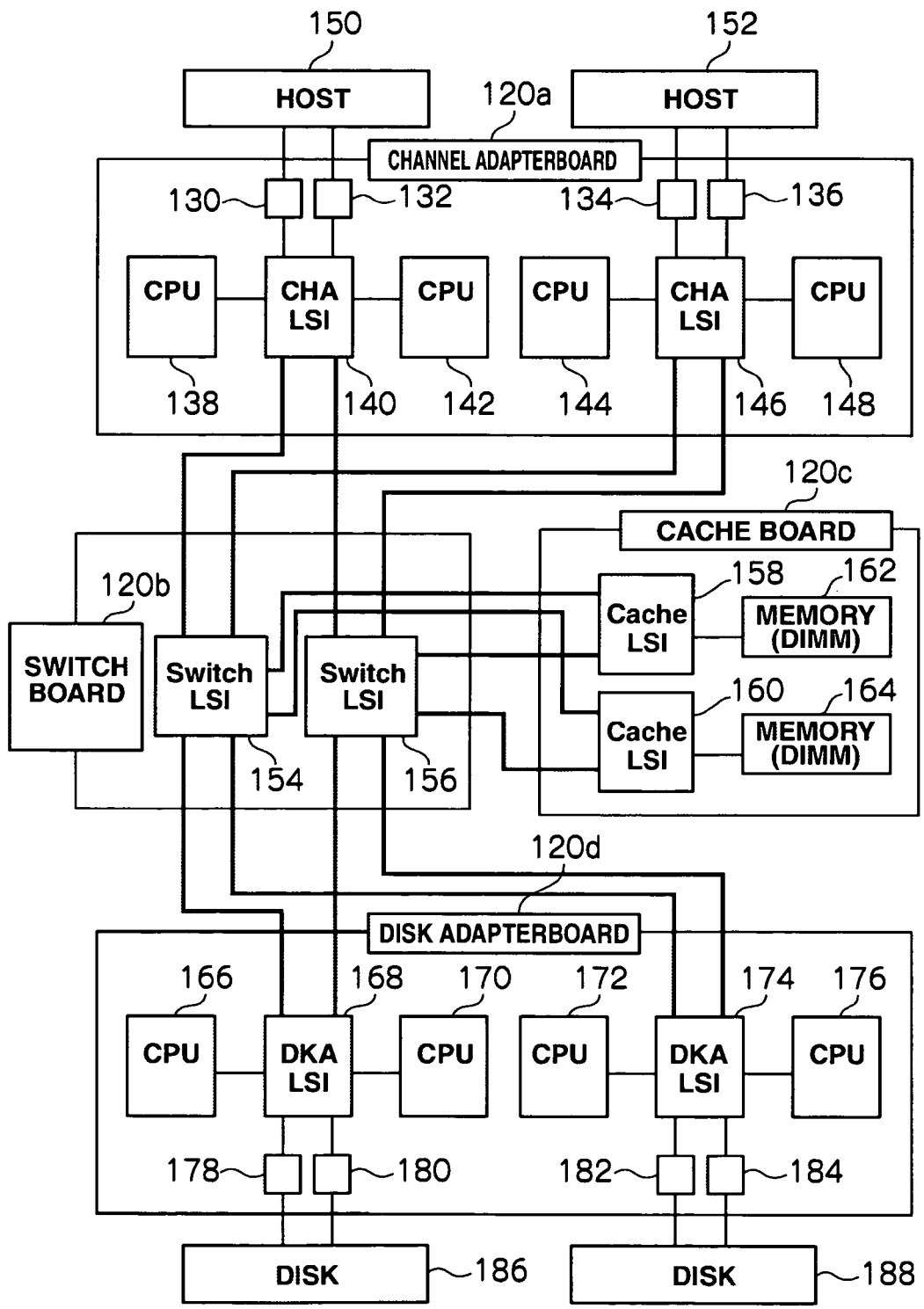
FIG. 34 is a block diagram showing an example where the semiconductor integrated circuit device according to this invention is applied to the disk array system.

Just like the foregoing substrate 50, the boards (substrates) 120 each have multiplex power supply circuits and, as shown in FIG. 34, are configured as channel adapter boards 120a switch boards 120b, cache boards 120c and disk adapter boards 120d.

Each channel adapter board 120a has: ports (input/output interfaces) 130, 132, 134 and 136; CPUs 138, 142, 144 and 148; and channel adapters LSI 140 and 146, mounted thereon. The ports 130 and 132 are connected to an external host computer 150 and the ports 134 and 136 are connected to another external host computer 152. Each switch board 120b has switch LSIs 154 and 156 mounted thereon for controlling data transfer between the channel adapter boards 120a, cache boards 120c, and disk adapter boards 120d. Each cache board 120c has cache LSIs 158 and 160 and mass storage memories (DIMM) 162 and 164 mounted thereon for temporarily storing the data in the disks 186 and 188. The foregoing switch LSI 154 is connected to the channel adapter LSIs 140 and 146 and cache LSIs 158 and 160 while the foregoing switch LSI 156 is connected to the channel adapter LSIs 140 and 146 and cache LSIs 158 and 160. Each disk adapter board 120d has: CPU 166, 170, 172 and 176; disk adapter LSIs 168 and 174; ports (input/output interfaces) 178, 180, 182 and 184 mounted thereon. The disk adapter LSIs 168 and 174 are connected to the switch LSIs 154 and 156 respectively; the ports 178 and 180 are connected to an external disk (memory device) 186; and the ports 182 and 184 are connected to another external disk (memory device) 188.

Each of the channel adapters LSIs 140 and 146, switch LSIs 154 and 156, cache LSIs 158 and 160 and disk adapter LSIs 168 and 174 mounted on the foregoing boards is configured from an LSI package 28 with an LSI chip 14 and external modules 20 and 22. Because the power supply circuit in each LSI is multiplexed, even when a failure occurs in the power supply circuit, the LSI still continues to operate, thereby improving the reliability of the LSI.

Also, because the disk array system has a plurality of boards of each type, multiplexing of the boards is realized and that also improves the reliability of the disk array system.

What is claimed is:

1. A disk array system, comprising:

a channel adapter board being adapted to be coupled to a plurality of host computers and comprising a channel adapter large scale integrated circuit (LSI) for controlling to transfer data received from each of the plurality of host computers;

a cache board comprising a cache LSI for controlling to store data temporarily;

a disk adapter board comprising a disk adapter LSI for controlling to store data in a plurality of disk drives;

a switch board being coupled to the channel adapter board, the cache board and the disk adapter board, and comprising a switch LSI for controlling to transfer data among the channel adapter board, the cache board and the disk adapter board; and the plurality of disk drives storing data received from the disk adapter board, wherein each of the channel adapter LSI, the cache LSI, the disk adapter LSI and switch LSI is configured from a single LSI package having a single LSI chip and a plurality of voltage conversion circuits, wherein the single LSI chip comprises an internal logic circuit, a power supply control circuit and a plurality of module control circuits, wherein each of the plurality of voltage conversion circuits converts voltage applied from an external power supply to internal voltage for driving the internal logic circuit in the single LSI chip, wherein each of the plurality of module control circuits controls to supply the voltage converted by one of the plurality of voltage conversion circuits to the internal logic circuit, monitors status of the one of the plurality of voltage conversion circuits, and outputs error information to the power supply control circuit, when an abnormality of the one of the plurality of voltage conversion circuits occurs, wherein the power supply control circuit outputs signals to the plurality of module control circuits to turn on/off the plurality of voltage conversion circuits, monitors status of each of the plurality of voltage conversion circuits by using the plurality of module control circuits, and outputs information of operational status of each of the plurality of voltage conversion circuits to the internal logic circuit, and wherein the internal logic circuit is configured to operate in a LSI high-load mode, in which the internal logic circuit performs high load of data transfer, when the internal logic circuit is powered on and does not perform any load of data transfer, so as to check whether power is supplied from each of the plurality of voltage conversion circuits to the internal logic circuit.

2. The disk array system according to claim 1, wherein, when the plurality of voltage conversion circuits receive the electric power from the external power supply, the power supply control circuit commands the plurality of voltage conversion circuits to perform a self-test and starts the plurality of voltage conversion circuits when results of the self-test by the plurality of voltage conversion circuits are normal.

3. The disk array system according to claim 2, wherein the power supply control circuit stops the operation of the internal logic circuit, when one of results of the self-test by the plurality of voltage conversion circuits is abnormal.

4. The disk array system according to claim 1, wherein, once the plurality of voltage conversion circuits are started, the power supply control circuit commands the internal logic circuit to perform a self-test and starts the internal logic circuit, when results of the self-test by the internal logic circuit are normal.

5. The disk array system according to claim 1, wherein the power supply control circuit commands the plurality of voltage conversion circuits to change from a power supply path of one of the plurality of voltage conversion circuits to another power supply path of another one of the plurality of voltage conversion circuits, when a result of a self-test by the internal logic circuit reveals a power failure.

6. The disk array system according to claim 5, wherein the power supply control circuit stops the operation of the internal logic circuit, when the result of the self-test by the internal logic circuit reveals an abnormality in the internal logic circuit.

7. The disk array system according to claim 6, wherein, after stopping the operation of the internal logic circuit,, the power supply control circuit restarts the internal logic circuit.

8. The disk array system according to claim 1, wherein the channel adapter board comprises a plurality of the channel adapter LSIs, the cache board comprises a plurality of the cache LSIs, the disk adapter board comprises a plurality of the, disk adapter LSIs, and the switch board comprises a plurality of the switch LSIs.

* * * * *

UNITED STATES PATENT AND TRADEMARK OFFICE
CERTIFICATE OF CORRECTION

PATENT NO. : 7,596,706 B2
APPLICATION NO. : 11/430159
DATED : September 29, 2009
INVENTOR(S) : Tomokatsu Fuseya It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 677 days.

Signed and Sealed this

Twenty-eighth Day of September, 2010

David J. Kappos
*Director of the United States Patent and Trademark Office*